(12) United States Patent
Zierath et al.

(10) Patent No.: US 11,769,729 B2
(45) Date of Patent: Sep. 26, 2023

(54) METAL STRUCTURES, DEVICES, AND METHODS

(71) Applicant: Intel Corporation, Santa Clara, CA (US)

(72) Inventors: Daniel J. Zierath, Portland, OR (US); Michael McSwiney, Scappoose, OR (US); Jason Farmer, Hillsboro, OR (US); Akm Shaestagir Chowdhury, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 941 days.

(21) Appl. No.: 16/015,045

(22) Filed: Jun. 21, 2018

(65) Prior Publication Data

US 2019/0393156 A1 Dec. 26, 2019

(51) Int. Cl.
*H01L 23/532* (2006.01)
*H01L 21/285* (2006.01)
*H01L 21/768* (2006.01)
*H01L 23/522* (2006.01)
*H01L 25/065* (2023.01)
*C22C 19/07* (2006.01)
(Continued)

(52) U.S. Cl.
CPC ........ *H01L 23/53209* (2013.01); *C22C 19/00* (2013.01); *C22C 19/03* (2013.01); *C22C 19/07* (2013.01); *C22C 30/00* (2013.01); *C23C 16/0281* (2013.01); *C23C 16/045* (2013.01); *C23C 16/06* (2013.01); *H01L 21/28556* (2013.01); *H01L 21/76846* (2013.01); *H01L 21/76847* (2013.01); *H01L 21/76849* (2013.01); *H01L 21/76876* (2013.01); *H01L 23/5226* (2013.01); *H01L 23/53223* (2013.01); *H01L 23/53266* (2013.01); *H01L 25/0652* (2013.01)

(58) Field of Classification Search
CPC ......... H01L 23/53209; H01L 21/28556; H01L 21/76846; H01L 21/76847; H01L 21/76849; H01L 21/76876; H01L 23/5226; H01L 23/53223; H01L 23/53266; H01L 25/0652; C22C 19/00; C22C 19/03; C22C 19/07; C23C 16/045; C23C 16/06
See application file for complete search history.

(56) References Cited

U.S. PATENT DOCUMENTS

2007/0189916 A1  8/2007  Zhang
2012/0225317 A1  9/2012  Imran et al.
(Continued)

FOREIGN PATENT DOCUMENTS

EP      1785505 A1    5/2007
WO    2016111833 A1   7/2016

OTHER PUBLICATIONS

PCT Application No. PCT/US2017/049938 filed Sep. 1, 2017, entitled "Metal Interconnects, Devices, and Methods," Inventor(s): Daniel Zierath, et al.
(Continued)

*Primary Examiner* — Matthew L Reames
(74) *Attorney, Agent, or Firm* — Akona IP

(57) ABSTRACT

Provided herein are metal structures that may include a cobalt alloy, a nickel alloy, or nickel, as well as related devices and methods. The metal structures may be formed by chemical vapor deposition (CVD), and may include trace amounts of precursor materials used during the CVD process.

20 Claims, 12 Drawing Sheets

(51) Int. Cl.
  *C23C 16/02* (2006.01)
  *C22C 30/00* (2006.01)
  *C23C 16/06* (2006.01)
  *C22C 19/03* (2006.01)
  *C23C 16/04* (2006.01)
  *C22C 19/00* (2006.01)

(56) References Cited

U.S. PATENT DOCUMENTS

2014/0287582 A1    9/2014   Honda
2017/0133325 A1    5/2017   Chae et al.
2018/0130703 A1*   5/2018   Sardesai ........... H01L 21/76889

OTHER PUBLICATIONS

Nov. 8, 2019—Extended European Search Report from European Application No. 19175267.4; 9 pages.
Paunovic, M., et al., "Electrochemically Deposited Diffusion Barriers," Journal of the Electrochemical Society, vol. 141, No. 7, Jul. 1, 1994, pp. 1843-1850.

* cited by examiner

METAL STRUCTURES, DEVICES, AND METHODS

BACKGROUND

Integrated circuit (IC) devices typically include circuit elements such as transistors, capacitors, and resistors formed within or on a semiconductor substrate. Interconnect structures are used to electrically couple or connect the discrete circuit elements into functional circuits.

DETAILED DESCRIPTION

Figure 1A:
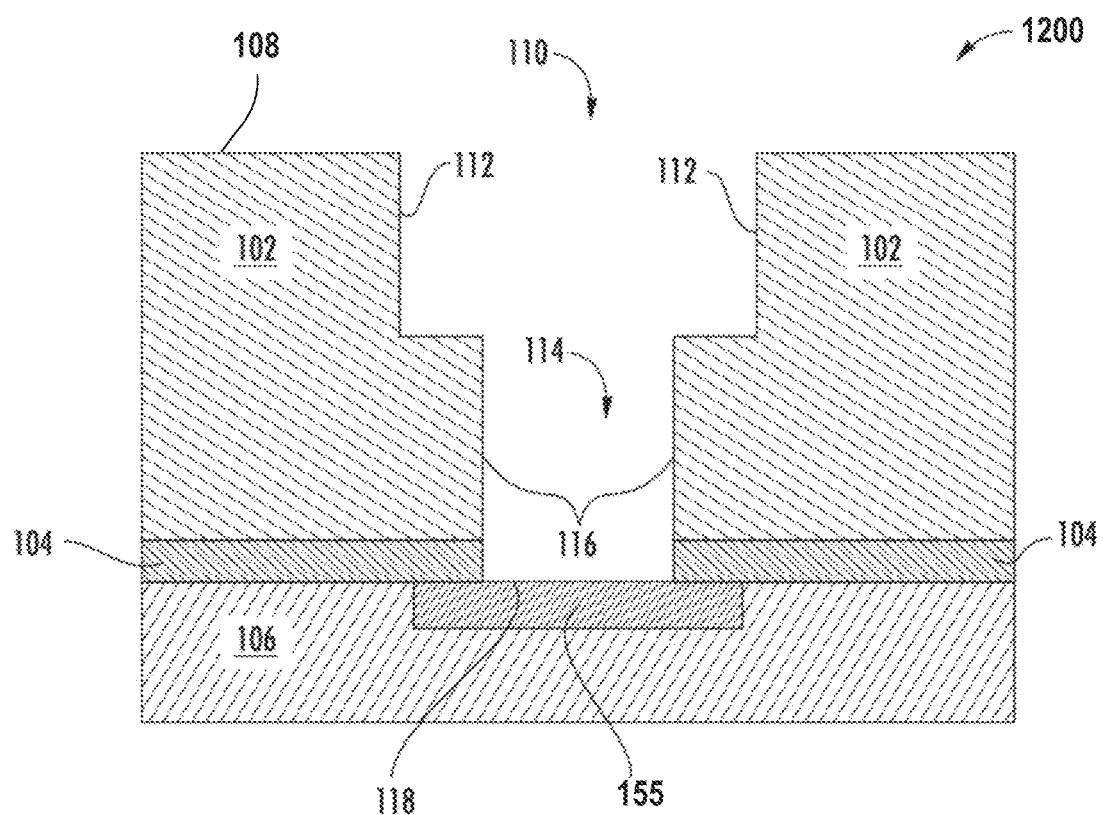
FIGS. 1A-1F are side, cross-sectional views of various stages in the fabrication of a metal interconnect, in accordance with various embodiments.

Conventional interconnect structures may be formed of copper (Cu) or tungsten (W). Copper and tungsten, however, may present difficulties when attempting to scale down the size of the interconnects. For example, void-free fabrication of interconnects is difficult when copper or tungsten is used, particularly as the interconnects decrease in size. When tungsten is used, a barrier/adhesion layer (e.g., a tantalum (Ta) barrier) and a nucleation layer may also be used; however, a nucleation layer tends to have a relatively high resistance, and the processing of tungsten typically relies on chemical vapor deposition (CVD) or a conformal process, which may cause undesirable seams, keyholes, or a combination thereof in the interconnect structure. When copper is used, the resistivity of the interconnect structures may increase as the dimensions of the structure are decreased, and undesirable electromigration may worsen.

Other materials may be used in interconnects. For example, cobalt (Co) may have a lower resistivity than tantalum barriers and tungsten nucleation layers, a higher melting point than copper (which results in a relatively high activation energy for diffusion, thereby mitigating electromigration and improving reliability), the ability to recrystallize upon annealing (thereby enabling reflow for better gap fill), and/or better adhesion strength to oxide than copper does.

Nevertheless, the use of cobalt as a metal interconnect material may be challenging due to the fact that cobalt interconnects are susceptible to corrosion, especially at a pH less than 9. Employing solutions having a higher pH during fabrication, however, may not be practical or possible. Other challenges that may be associated with cobalt-based interconnect structures may include stress-induced voiding.

Provided herein are metal interconnects including a cobalt alloy, nickel, a nickel alloy, or a combination thereof that may be less susceptible to corrosion than cobalt, as well as techniques and precursor materials for fabricating such interconnects. Some embodiments of the metal interconnects provided herein may be less susceptible to corrosion than previous cobalt interconnects, while having or maintaining low resistance, reliability, or a combination thereof. Some embodiments of the metal interconnects provided herein may be less susceptible to at least one of stress-induced voiding or electromigration than previous cobalt interconnects. In particular embodiments, the metal alloys of the interconnects provided herein have a higher melting point than previous cobalt interconnects. Some embodiments of the metal interconnects disclosed herein may have a higher activation energy than previous cobalt interconnects, thereby reducing interdiffusion, stress-induced voiding, and/or electromigration. Some embodiments of the metal alloys provided herein may be less susceptible to corrosion and voiding migration than previous cobalt interconnects, which may result in an improved end-of-line yield.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "integrated circuit (IC) package" are synonymous. When used to describe a range of dimensions, the phrase "between X and Y" represents a range that includes X and Y. For convenience, the phrase "FIG. 1" may be used to refer to the collection of drawings of FIGS. 1A-1F.

The metal interconnects 100 disclosed herein may include a compound according to formula (I):

$$Co_b Q_q Z_z \qquad \text{(formula(I))},$$

wherein b, q, and z are weight percentages of the total weight of the compound of formula (I); the sum of b, q, and z is equal to 100%; Q, when z is 0%, is selected from nickel (Ni), aluminum (Al), manganese (Mn), silicon (Si), chromium (Cr), vanadium (V), molybdenum (Mo), niobium (Nb), Ta, W, or zirconium (Zr); Q, when z is not 0%, is selected from Ni, Al, Mn, Si, Cr, V, Nb, or Ta; and Z is selected from Mo or W.

The metal interconnects 100 disclosed herein may include a compound according to formula (II):

$$Ni_d X_e G_f \qquad \text{(formula(II))};$$

wherein d, e, and f are weight percentages of the total weight of the compound of formula (II); the sum of d, e, and f is equal to 100%; X, when f is 0%, is selected from Co, Al, Mn, Si, Cr, V, Mo, Nb, Ta, or W; X, when f is not 0%, is selected from Co, Al, Mn, Si, Cr, V, Nb, or Ta; and G is selected from Mo or W.

For example, the metal interconnects 100 disclosed herein may include a compound according to formula (III) or formula (IV)—

$$Co_b Q_q Z_z \qquad \text{(formula (III))},$$

$$Ni_d X_e G_f \qquad \text{(formula (IV))};$$

wherein b is a weight percentage of about 50% to about 99.99% based on the total weight of the compound of formula (I); q is a weight percentage of about 0.01% to about 50% based on the total weight of the compound of formula (I); z is a weight percentage of 0% to about 49.9% based on the total weight of the compound of formula (I); Q, when z is 0%, is selected from Ni, Al, Mn, Si, Cr, V, Mo, Nb, Ta, W, or Zr; Q, when z is not 0%, is selected from Ni, Al, Mn, Si, Cr, V, Nb, or Ta; Z is selected from Mo or W; d is a weight percentage of about 50% to 100% based on the total weight of the compound of formula (II); e is a weight percentage of 0% to about 50% based on the total weight of the compound of formula (II); f is a weight percentage of 0% to about 49.99% based on the total weight of the compound of formula (II); X, when f is 0%, is selected from Co, Al, Mn, Si, Cr, V, Mo, Nb, Ta, or W; X, when f is not 0%, is selected from Co, Al, Mn, Si, Cr, V, Nb, or Ta; and G is selected from Mo or W.

The metal interconnects 100 may include the compounds of formula (I) or formula (II) in any of a number of regions of an interconnect, such as a barrier and/or adhesion layer, a seed layer, a fill material, or a cap. Such embodiments are discussed in further detail below.

Some examples of the metal interconnects 100 disclosed herein may include a compound according to formula (I), wherein Q is Ni; b is about 80% to about 95%; q is about 5% to about 20%; and z is 0%. In some embodiments, the metal interconnects 100 include a compound according to formula (I), wherein Q is Ni; b is about 84% to about 88%; q is about 12% to about 16%; and z is 0%. In further embodiments, the metal interconnects include a compound according to formula (I), wherein Q is Ni; b is about 86%; q is about 14%; and z is 0%. In still further embodiments, the metal interconnects 100 may include a compound according to formula (I), wherein Q is Ni; b is about 96% to about 99%; q is about 1% to about 4%; and z is 0%. In additional embodiments, the metal interconnects 100 may include a compound according to formula (I), wherein Q is Ni; b is about 96% to about 98%; q is about 2% to about 4%; and z is 0%. In particular embodiments, the metal interconnects 100 may include a compound according to formula (I), wherein Q is Ni; b is about 97%; q is about 3%; and z is 0%. In certain embodiments, the metal interconnects 100 include a compound according to formula (I), wherein Q is Si, and z is 0%.

Some examples of the metal interconnects 100 include a compound according to formula (II), wherein e and f are 0%.

Some examples of the metal interconnects 100 include a compound according to formula (II), wherein d is about 90% to about 92%, f is 0%, X is selected from V or W, and e is about 8% to about 10%. In another embodiment, the metal interconnects 100 include a compound according to formula (II), wherein d is about 80% to about 84%, e is about 8% to about 10%, X is V, f is about 8% to about 10%, and G is W.

Some examples of the metal interconnects 100 include a compound according to formula (I) or a compound according to formula (II) that includes at least one of Mo or W, wherein the Mo or W is independently present at a weight percentage of about 0.01% to about 1%, based on the total weight of the compound according to formula (I) or the compound according to formula (II), respectively.

Not wishing to be bound by any particular theory, it is believed that the inclusion of Mo or W in a compound of formula (I) and/or formula (II) can lower the bulk resistivity, impart a melting point greater than the melting point of cobalt or nickel, or a combination thereof, thereby possibly improving performance, increasing the activation energy, reducing the interdiffusion, or a combination thereof. Not wishing to be bound by any particular theory, it is believed that, due to their relatively high affinity for forming metal oxide bonds, the inclusion of Al, Mn, Si, Cr, V, Ta, or Nb in a compound of formula (I) and/or formula (II) may passivate a cobalt or nickel surface, thereby preventing or reducing the likelihood of corrosion. Al, Mn, Si, and Cr are believed to be fast diffusers in metal, form very stable metal oxides, or a combination thereof. $Al_2O_3$, $Cr_2O_3$, $SiO_2$, $MnO_2$, and $MnO$ have negative heats of formation that are about five to about six times greater than that of CoO. Not wishing to be bound by any particular theory, it is believed that the inclusion of Cr, Ta, Nb, or V in a compound of formula (I) and/or formula (II) can impart a melting point greater than the melting point of cobalt and/or nickel, which may increase activation energy and/or reduce the interdiffusion, thereby improving stress-induced voiding and electromigration. Not wishing to be bound by any particular theory, it is believed that Pourbaix diagrams of Cr suggest a wider pH window for a passive metal oxide layer formation, compared to Co. At a neutral pH, Cr may form $Cr_2O_3$, which can be a very stable oxide.

The metal interconnects 100 disclosed herein may include a compound according to formula (I), a compound according to formula (II), or a compound according to formula (I) and a compound according to formula (II).

As noted above, in some embodiments, the metal interconnects 100 provided herein include a compound according to formula (I), and the compound according to formula (I) is present in at least one of the barrier and/or adhesion layer, the seed layer, the fill material, or the cap. In other embodiments, the metal interconnects 100 provided herein include a compound according to formula (II), and the compound according to formula (II) is present in at least one of the barrier and/or adhesion layer, the seed layer, the fill material, or the cap. For example, a compound of formula (I) or a compound of formula (II) may be present in [1] a barrier and/or adhesion layer, [2] a seed layer, [3] a fill material, [4] a cap, [5] a barrier and/or adhesion layer and a seed layer, [6] a barrier and/or adhesion layer and a fill material, [7] a seed layer and a fill material, [8] a fill material and a cap, [9] a barrier and/or adhesion layer, a fill material, a seed layer, and a cap, etc.

As used herein, the phrase "is present in at least one of the barrier and/or adhesion layer, the seed layer, the fill material, or the cap" describes a compound of formula (I) and/or formula (II) that is present in at least one of a barrier and/or adhesion layer, a seed layer, a fill material, or a cap prior to, during, or after the barrier and/or adhesion layer, the seed layer, the fill material, and the cap is deposited (e.g., in a damascene or dual damascene process, such as the processes discussed below). For example, a compound of formula (I) and/or (II) may be present in a seed layer before the seed layer is deposited in a damascene or dual damascene structure. As a further example, a compound of formula (I) and/or (II) may not be present in a seed layer prior to or during the depositing of the seed layer in a damascene or dual damascene structure, but a compound of formula (I) and/or (II) may be present in the seed layer after further processing, such as annealing, is performed. In each of these examples, the metal interconnect 100 includes a seed layer in which a compound of formula (I) and/or formula (II) is present.

As used herein, the phrase "is present in" should not be construed as defining the composition of a barrier and/or adhesion layer, a seed layer, a fill material, or a cap. For example, in one embodiment, a compound of formula (I) "is present in" a seed layer, and the seed layer may include [1] only the compound of formula (I), or [2] the compound of formula (I) and at least one other component.

In some embodiments, the metal interconnects 100 disclosed herein include a compound according to formula (I) and a compound according to formula (II), and the compounds according to formula (I) and formula (II) independently are present in at least one of the barrier and/or adhesion layer, the seed layer, the fill material, or the cap. The compound according to formula (I) and the compound according to formula (II) may be present in one or more of the same layers or materials, one or more different layer or materials, or a combination thereof. For example, a compound according to formula (I) may be present in a seed layer, and a compound according to formula (II) may be present in a fill material. As a further example, a compound according to formula (I) and a compound according to formula (II) may be present in a seed layer. As another example, a compound according to formula (I) may be present in a seed layer and a fill material, and a compound according to formula (II) may be present in the fill material and a barrier and/or adhesion layer.

Methods of forming metal interconnects 100 including at least one compound according to formula (I), at least one compound according to formula (II), or a combination thereof are discussed below with reference to FIGS. 1-5. In embodiments, the methods of forming metal interconnects 100 include providing a damascene or a dual damascene structure; depositing a barrier and/or adhesion layer on the damascene or the dual damascene structure; depositing a seed layer on the barrier and/or adhesion layer; depositing a fill material in the damascene or dual damascene structure; and depositing (i) an overburden, or (ii) a cap on the fill material. At least one of the barrier and/or adhesion layer, the seed layer, the fill material, the overburden, or the cap may include at least one compound according to formula (I), at least one compound according to formula (II), or a combination thereof. The methods provided herein also may include one or more additional features, such as annealing the metal interconnect, polishing the metal interconnect 100, removing one or more portions of the layer(s) and/or material(s) deposited outside of a damascene or dual damascene structure, or combination thereof.

When the methods provided herein include depositing an overburden, the methods may also include [1] annealing the metal interconnect 100, [2] polishing the overburden, or [3] annealing the metal interconnect 100 and polishing the overburden. The polishing may be achieved by any known technique, such as chemical mechanical planarization (CMP).

When the methods provided herein include depositing a cap, the methods may also include removing at least a portion of the barrier and/or adhesion layer, the fill material, the seed layer, or a combination thereof deposited outside of the damascene or the dual damascene structure. The removing of at least a portion of the barrier and/or adhesion layer, the fill material, the seed layer, or a combination thereof may be performed prior to depositing a cap, and achieved by any known techniques. In one embodiment, the removing includes CMP.

The assemblies of the methods discussed herein may include any known structures. In embodiments, an assembly includes a dielectric layer deposited on a substrate; and an opening in the dielectric layer, the opening having a lower portion and an upper portion, wherein the upper portion is wider than the lower portion. In further embodiments, the assembly includes a dielectric layer deposited on a substrate; and an opening in the dielectric layer that exposes a conductive region of the substrate, the opening having a lower portion and an upper portion, wherein the upper portion is wider than the lower portion.

One embodiment of an assembly 1200 is depicted in FIG. 1A. FIG. 1A depicts a substrate 106 with top surface 108 that may be used as a substrate onto which an interconnect may be formed. The substrate 106 can include any portion of a partially fabricated IC on which a metal interconnect may be fabricated. For example, the substrate 106 may include, or may have formed thereon, active and/or passive devices. As depicted at FIG. 1A, a conductive region 155 is included in the substrate 106, onto which a metal interconnect 100 may be formed. The substrate 106 may be processed through front end-of-line (FEOL), and the conductive region 155 may be a diffusion region formed in a crystalline semiconductor substrate or layer. For example, the conductive region may be a source or drain region of a transistor. The conductive region 155 may be an underlying metal line in a back end-of-line (BEOL) metallization structure. Although embodiments of an assembly 1200 may be ideally suited for fabricating semiconductor integrated circuits, including, but not limited to, microprocessors, memories, charge-coupled devices (CCDs), system on chip (SoC) ICs, or baseband processors, other applications can also include microelectronic machines, microelectromechanical systems (MEMS), lasers, optical devices, packaging layers, etc. Embodiments of the assembly 1200 also may be used to fabricate individual semiconductor devices, including, but not limited to, a gate electrode of a metal oxide semiconductor (MOS) transistor.

The assembly 1200 depicted in FIG. 1A includes a dielectric material 102 formed above the substrate 106. The dielectric material 102 may include any suitable dielectric or insulating material, such as silicon dioxide, SiOF, carbon-doped oxide, a glass or polymer material. The opening in the dielectric material 102 exposes the conductive region 155, to which contact by an interconnect is ultimately made, and the opening includes a lower opening 114 with sidewalls 116 and an upper opening 110 with sidewalls 112. Although two openings are depicted, it is to be appreciated that a single opening may instead be formed in the dielectric material 102, as is used, for example, in a single damascene approach where only a line or a via, but not both, is fabricated in a single operation. The opening or openings may be fabricated in the dielectric material 102 by known lithography and etch processing techniques typically used in damascene and dual damascene type fabrication. Although only a single dielectric material 102 is depicted, multiple layers of the same or differing dielectric materials may instead be used. For example, a first dielectric layer may have the opening 114 therein, and a second dielectric layer may have the opening 110 therein. In the embodiment depicted at FIG. 1A, the dielectric material 102 is on an etch stop layer 104 deposited on the substrate 106. The etch stop layer 104 may include any suitable material, such as silicon nitride, silicon oxynitride, or a combination thereof.

Embodiments of the methods provided herein include "depositing" a layer or material on another layer or material. The "depositing" may be achieved by any known techniques that may be appropriate for a particular layer or material, including, but not limited to, CVD, atomic layer deposition (ALD), physical vapor deposition (PVD), electroplating, electroless plating, one or more other suitable processes that deposit conformal thin films, or a combination thereof.

Deposition recipes of thin films using processes such as CVD, ALD, and PVD may vary depending on the desired process time, thickness, and quality of conformity. For example, utilizing CVD to deposit a seed layer may create a conformal thin film layer more quickly than it would take an ALD process to deposit the same layer; however, the quality of the thin film deposited by the CVD process may be lower than the quality of the thin film deposited by the ALD process. A PVD process may be performed with an increased distance between the receiving substrate and the corresponding sputter target to form a conformal thin film.

Figure 1B:
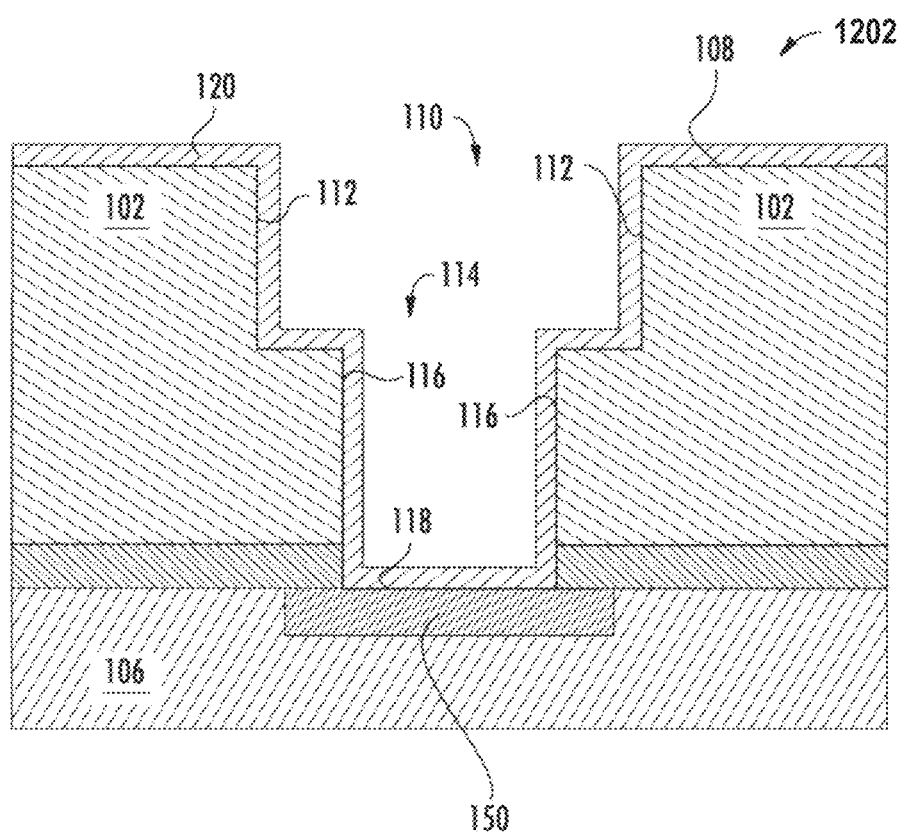

FIG. 1B depicts an assembly 1202 subsequent to forming a barrier/adhesion layer 120 on the assembly 1200 (FIG. 1A). The barrier/adhesion layer 120 may be formed on a top surface 108 of the dielectric material 102 as well as on the exposed top surface 108 of the substrate 106 (e.g., on conductive region 155). In the embodiment depicted at FIG. 1B, the barrier/adhesion layer 120 is also formed on the sidewalls 116 of the lower opening 114, and the sidewalls 112 of the upper opening 110. The barrier/adhesion layers 120 disclosed herein may include Ta, TaN, TiN, WN, or a combination thereof. In one embodiment, the barrier/adhesion layer 120 is a tantalum nitride/tantalum (TNT) layer. In another embodiment, the barrier/adhesion layer 120 is a titanium nitride/titanium layer. In some embodiments, however, no barrier/adhesion layer 120 is used in the methods or included in the metal interconnects 100 provided herein. When no barrier/adhesion layer 120 is used, a seed layer may be formed directly on a dielectric material 102 and, if present, a conductive region 155.

Figure 10:
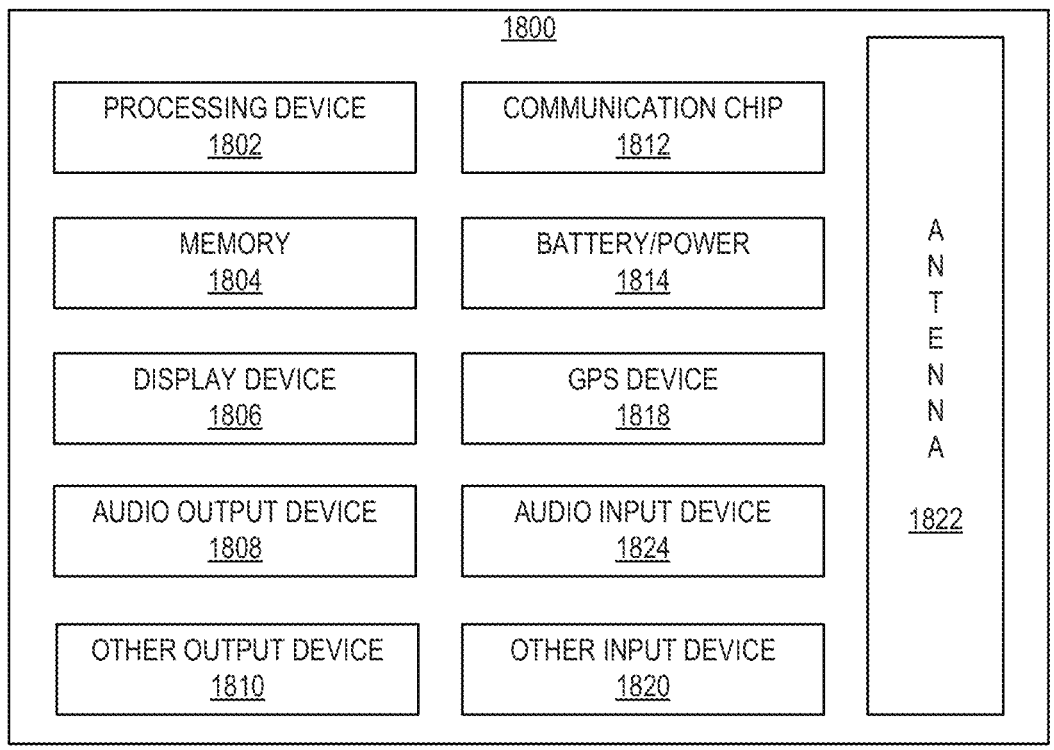
FIG. 10 is a block diagram of an example electrical device that may include a metal interconnect in accordance with any of the embodiments disclosed herein.

FIG. 10 depicts an assembly 1204 subsequent to forming a seed layer 130 on the assembly 1202 (FIG. 1B). The seed layer 130 of FIG. 10 is deposited on the barrier/adhesion layer 120. The seed layers 130 disclosed herein may include cobalt, a compound of formula (I), a compound of formula (II), or a combination thereof. The seed layer 130 may be a conformal layer. In one embodiment, the seed layer 130 may have a thickness less than 3 nanometers. For example, the seed layer 130 may have a thickness between about 1 nanometer and about 3 nanometers. The seed layer 130 may act as a nucleation layer for the growth of subsequent fill materials. The seed layer 130 may include any known seed layer material. The seed layer 130 may include cobalt. For example, in one embodiment, the seed layer 130 includes at least 50% cobalt by weight of the seed layer 130. In a particular embodiment, the seed layer 130 includes about 90% to 100% cobalt by weight of the seed layer 130. Non-limiting examples of cobalt-based compound seed layers 130 include cobalt silicide or cobalt germanide seed layers.

In embodiments in which the seed layer 130 includes a compound of formula (I) and/or a compound of formula (II), a CVD or ALD process may be used to deposit the seed layer 130. To do so, one or more precursors 170 may be utilized as part of the CVD/ALD process.

In embodiments in which the seed layer 130 includes cobalt in the compound of formula (I) and/or the compound of formula (II), example precursors 170 include:
- (A1) Cobalt carbonyls with bridging acetylene moieties of the general formula $(CO)_6Co_2C_2RR'$ where R and R' can be a hydrogen, an alkyl group (methyl, ethyl, propyl, butyl, t-butyl, isopropyl, sec-butyl, etc.), an $SiR_3$ group (where R can be an alkyl group in accordance with any of the embodiments discussed above), or other appropriate ligand;
- (A2) Cobalt amidinates of the general formula $Co(^tBuNC(R)NEt)_2$ or $Co(^iPrNC(R)NEt)_2$ where R can be Me, Et, n-Bu, or other alkyl groups;
- (A3) Cobalt carbonyl and nitrosyl compounds including $Co_2(CO)_8$ or $Co(CO)_3NO$;
- (A4) Cobalt acetylacetonate $(Co(acac)_3)$;
- (A5) Cobalt cyclopentadienyl precursors of the general formulas $Co(Cp)_2$, $Co(Cp^*)_2$, $Co(R-Cp)_2$, $Co(Cp)(CO)_2$, $Co(Cp^*)(CO)_2$, and $Co(R-Cp)(CO)_2$, where R can be an alkyl group (methyl, ethyl, propyl, isopropyl, butyl, t-butyl, sec-butyl, etc.);
- (A6) Bis amino compounds of Co of the general formula $Co[N(R)_2]_2$ where R is an alkyl, aryl or other group including methyl, ethyl, propyl, isopropyl, butyl, t-butyl, sec-butyl, etc.;
- (A7) Perflourophosphine functionalized cobalt precursors such as $Co(PF_3)_4H$;
- (A8) Diazabutadiene functionalized cobalt precursors including, but not limited to, bis(1,4-di-iso-propyl-1,4-diazabutadiene) cobalt; or
- (A9) Heteroleptic precursors containing both a cyclopentadienyl moiety and an amidinate moiety of the general formula $(R-Cp)Co(AMD)$ or $(Cp^*)Co(AMD)$ where the R functionalization of the cyclopentadiene ligand includes, but is not limited to, methyl, ethyl, propyl, isopropyl, butyl, t-butyl, or sec-butyl, and the amidinate groups include but are not limited to $(^tBuNC(R)NEt)$ or $(PrNC(R)NEt)_2$ where R can be Me, Et, n-Bu, or other alkyl groups.

In embodiments in which the seed layer 130 includes nickel in the compound of formula (I) and/or the compound of formula (II), example precursors 170 include:
- (B1) Nickel amino alkoxy precursors including $Ni(dmab)_2$, $Ni(emab)_2$, and $Ni(deab)_2$, or any precursor using a ligand of the general formula $(NRR'C_2H_3R''O)$, where R, R', and R" can be any alkyl group including methyl, ethyl, propyl, isopropyl, butyl, t-butyl, or sec-butyl;
- (B2) Nickel amidinates of the general formula $Ni(^tBuNC(R)NEt)_2$ or $Ni(^iPrNC(R)NEt)_2$, where R can be Me, Et, n-Bu, or other alkyl groups;

(B3) Tetrakis(perfluorophosphine) nickel (Ni(PF$_3$)$_4$);
(B4) Bis(cyclooctadienyl) nickel (Ni(COD)$_2$);
(B5) Nickel cyclopentadienyl precursors of the general formulas Ni(Cp)$_2$, Ni(Cp*)$_2$, Ni(R-Cp)$_2$, where R can be an alkyl group (methyl, ethyl, propyl, isopropyl, butyl, t-butyl, sec-butyl, etc.);
(B6) Nickel precursors, which are based on allyl and alkylpyrrolylimine ligands [Ni(allyl)(PCAl—R)];
(B7) Bis(dialkylamino) nickel precursors of the general formula Ni(NR$_2$)$_2$, where R can be an alkyl group (methyl, ethyl, propyl, isopropyl, butyl, t-butyl, sec-butyl, etc.); or
(B8) Amino imino complexes of nickel such as bis(4-N-ethylamino-3-penten-2-N-ethyliminato)Nickel(II).

In embodiments in which the seed layer 130 includes aluminum in the compound of formula (I) and/or the compound of formula (II), example precursors 170 include:
(C1) Tri-alkyl aluminum precursors of the general formula AlR3, where R can be a methyl, ethyl, propyl, isopropyl, butyl, t-butyl, sec-butyl, etc.;
(C2) Di-alkyl aluminum hydride precursors of the general formula AlR$_2$H, where R can be a methyl, ethyl, propyl, butyl, t-butyl, isopropyl, sec-butyl, etc.;
(C3) Aluminum trihalides of the general formula AlX$_3$, where X can be a fluorine, chlorine, bromine or iodine;
(C4) Various alane adducts consisting of an alane molecule, AlH$_3$, adducted to a Lewis base including but not limited to amines of the general formula NR$_3$, where R can be methyl, ethyl, propyl, butyl, t-butyl, isopropyl, sec-butyl, phenyl, or other complex alkyl or aryl group; or
(C5) Aluminum acetoacetonate (Al(acac)$_3$).

In embodiments in which the seed layer 130 includes manganese in the compound of formula (I) and/or the compound of formula (II), example precursors 170 include:
(D1) Cyclopentadienyl manganese carbonyls of the forms (Cp)Mn(CO)$_3$, (Cp)Mn(CO)$_3$, and (RCp)Mn(CO)$_3$, where the R functionalization of the cyclopentadiene ligand may include, but is not limited to, methyl, ethyl, butyl, t-butyl, isopropyl, propyl, or sec-butyl;
(D2) Homoleptic compounds of manganese with two functionalized piperidyl ligands such as bis(2,2,6,6-tetramethylpiperidyl)manganese(II), in which the piperidyl may be functionalized with other alkyl groups apart from methyl groups (such as in the examples above);
(D3) Homoleptic compounds of manganese with three functionalized heptanedione ligands such as Mn(thd)$_3$, where thd=2,2,6,6-tetramethylheptan-3,5-dione, in which the heptan-3,5-dione may be functionalized with other alkyl groups apart from methyl groups (such as in the examples above);
(D4) Bis cyclopentadienyl manganese compounds of the general formula Mn(CpR)$_2$ or Mn(CpR)(CpR') where the R and/or R' functionalization of the cyclopentadiene ligand may include, but are not limited to, methyl, ethyl, butyl, t-butyl, isopropyl, propyl, or sec-butyl; or
(D5) Imino alkoxy compounds of manganese such as Mn$_2$($^t$BuNCHC($^t$Bu)(Me)O)$_4$.

In embodiments in which the seed layer 130 includes chromium in the compound of formula (I) and/or the compound of formula (II), example precursors 170 include:
(E1) Chromium acetoacetonate (Cr(acac)$_3$);
(E2) Chromium oxychloride (Cr(OCl)$_3$);
(E3) Bis benzyl compounds of chromium of the general form Cr(benzyl)$_2$;
(E4) Bis alkyl benzyl compounds of chromium of the general forms Cr(R-benzyl)$_2$ or Cr(R-benzyl)(R'-benzyl) where the R and/or R' functionalization of the benzyl ligand may include, but are not limited to, methyl, ethyl, butyl, t-butyl, isopropyl, propyl, or sec-butyl; or
(E5) Chromium halides of the general formula CrX$_3$, where X can be a fluorine, chlorine, bromine or iodine.

In embodiments in which the seed layer 130 includes vanadium in the compound of formula (I) and/or the compound of formula (II), example precursors 170 include:
(F1) Vanadium halides of the general form VX$_4$, where X can be a fluorine, chlorine, bromine or iodine; or
(F2) Amino complexes of vanadium of the general form V(NR$_2$)$_4$ or V(NRR')$_4$, where the R and/or R' functionalization of the benzyl ligand may include, but are not limited to methyl, ethyl, butyl, t-butyl, isopropyl, propyl, or sec-butyl.

In embodiments in which the seed layer 130 includes tantalum in the compound of formula (I) and/or the compound of formula (II), example precursors 170 include:
(G1) Pentakis tantalum amides of the general forms Ta(NR$_2$)$_5$ or Ta(NRR')$_5$, where the R and/or R' may be, but are not limited to, methyl, ethyl, butyl, t-butyl, isopropyl, propyl, or sec-butyl; or
(G2) Amino/Imino complexes of tantalum of the general forms Ta(NR$_2$)$_3$(=NR") or Ta(NRR')$_3$(=NR"), where R, R', and/or R" may be, but are not limited to, methyl, ethyl, butyl, t-butyl, isopropyl, propyl, sec-butyl, pentyl, tert-pentyl, or neopentyl.

In embodiments in which the seed layer 130 includes niobium in the compound of formula (I) and/or the compound of formula (II), example precursors 170 include:
(H1) Amino/Imino complexes of niobium of the general forms Nb(NR$_2$)$_3$(=NR") or Nb(NRR')$_3$(=NR"), where R, R', and/or R" may be, but are not limited to, methyl, ethyl, butyl, t-butyl, isopropyl, propyl, sec-butyl, pentyl, tert-pentyl, or neopentyl;
(H2) Niobium pentahalides of the general formula NbX$_5$, where X may be fluorine, chlorine, bromine or iodine; or
(H3) Niobium tetrahalides of the general formula NbX$_4$, where X may be chlorine, bromine or iodine.

In embodiments in which the seed layer 130 includes molybdenum in the compound of formula (I) and/or the compound of formula (II), example precursors 170 include:
(I1) Molybdenum halides of the general formula MoX$_5$, where X may be chlorine, bromine or iodine;
(I2) Molybdenum amino/imino complexes of the general forms Nb(NR$_2$)$_2$(=NR")$_2$ or Nb(NRR')$_2$(=NR")$_2$, where R, R', and/or R" may be, but are not limited to, methyl, ethyl, butyl, t-butyl, isopropyl, propyl, sec-butyl, pentyl, tert-pentyl, or neopentyl;
(I3) Molybdenum oxyhalides including MoOX$_3$ (where X may be chlorine or bromine) or MoOX$_4$ (where X may be fluorine or chlorine);
(I4) Molybdenum carbonyl;
(I5) Bis benzyl complexes of molybdenum of the general formulas Mo(benzyl)$_2$ or Mo(R-benzyl)$_2$, where R may be, but is not limited to, methyl, ethyl, butyl, t-butyl, isopropyl, propyl, sec-butyl, pentyl, tert-pentyl, or neopentyl;
(I6) Tetrakis molybdenum amides of the general forms Mo(NR$_2$)$_4$ or Mo(NRR')$_4$, where the R and/or R' may be, but are not limited to methyl, ethyl, butyl, t-butyl, isopropyl, propyl, or sec-butyl;

(I7) Adducted halides of the general form $MoX_2(adduct)_2$, such as Molybdenum (IV) dichloride bis(THD) $(MoCl_2(THD)_2)$;

(I8) Tetrakis $\eta^3$-allyl complexes of molybdenum of the general form $Mo(R\text{-allyl})_4$, where R may be, but is not limited to, hydrogen, methyl, ethyl, butyl, t-butyl, isopropyl, propyl, or sec-butyl; or (I9) Heteroleptic carbonyl/phosphine compounds of molybdenum of the general formulas $Mo(CO)_5(PR_3)$ and $Mo(CO)_4(PR_3)_2$, where R may be, but is not limited to, methyl, ethyl, butyl, t-butyl, isopropyl, propyl, or sec-butyl.

In embodiments in which the seed layer 130 includes tungsten in the compound of formula (I) and/or the compound of formula (II), example precursors 170 include:

(J1) Tungsten carbonyl $(W(CO)_6)$;

(J2) Tungsten halides of the general form $WX_5$ and $WX_6$, where X may be chlorine, bromine or iodine;

(J3) Bis imino/amino compounds of tungsten of the general forms $W(NRR')_2(NR'')_2$, where R, R' and R'' can be the same or different functionality and may be, but are not limited to, methyl, trimethylsilyl, ethyl, butyl, t-butyl, isopropyl, propyl, or sec-butyl; or (J4) Bis cyclopentadienyl tungsten dihydrides of the general formula $(RC_5H_4)_2WH_2$, where R may be, but is not limited to, methyl, ethyl, butyl, t-butyl, isopropyl, propyl, or sec-butyl.

In embodiments in which the seed layer 130 includes silicon in the compound of formula (I) and/or the compound of formula (II), example precursors 170 include:

(K1) Silicon amides, substituted silanes (e.g., halide substituted silanes), amino-silanes, azidosilanes, cyclic amino-silanes, and cyclic-azido silanes.

Such silicon precursors 170 can be used with suitable co-reactants to deposit thin silicon layers which can be alloyed using one of the integration schemes described herein (e.g., with reference to FIGS. 1-4). In some embodiments in which the seed layer 130 includes silicon in the compound of formula (I) and/or the compound of formula (II), silane, disilane, or other higher silanes (trisilane, tetrasilane, pentasilane, neopentasilane) may be used as a co-reactant for one or more steps. In some embodiments in which the seed layer 130 includes silicon in the compound of formula (I) and/or the compound of formula (II), silicon-containing ligands (such as a trimethyl silyl) group could be substituted for one or more R groups in any of the compounds discussed above with reference to the precursors 170. Many silanes may be strong reducing agents in their own right.

When the seed layer 130 is deposited through CVD/ALD, the resulting seed layer 130 (and therefore the resulting metal interconnect 100) may include trace impurities that are characteristic of the ligand classes used in the precursors 170 (of which many examples are given above). In embodiments in which the seed layer 130 (and therefore the metal interconnect 100) includes carbon, precursors 170 used in the deposition of the seed layer 130 may include carbonyl, alkyl, aryl or other similar carbon-containing ligands, including the various cyclopentadienyl ligands, cyclooctadiene, acetylene derivatives, and simple alkyl groups. In embodiments in which the seed layer 130 (and therefore the metal interconnect 100) includes nitrogen, precursors 170 used in the deposition of the seed layer 130 may include amino, imino, or other nitrogen-containing ligands like amidinates and nitrosyls. In embodiments in which the seed layer 130 (and therefore the metal interconnect 100) includes oxygen, precursors 170 used in the deposition of the seed layer 130 may include alkoxides, carbonyls, acetylacetonate, oxyhalides, or other oxygen-containing ligands. In embodiments in which the seed layer 130 (and therefore the metal interconnect 100) includes phosphorous, precursors 170 (or co-reactants) used in the deposition of the seed layer 130 may include a phosphine functionality. In embodiments in which the seed layer 130 (and therefore the metal interconnect 100) includes a halogen, precursors 170 used in the deposition of the seed layer 130 may include such halogens as a direct ligand (chlorides, bromides, iodides, etc.), an oxoligand (e.g., oxychloride), or may functionalize a ligand of another element (such as perfluorophosphine). In embodiments in which the seed layer 130 (and therefore the metal interconnect 100) includes hydrogen, precursors 170 used in the deposition of the seed layer 130 may include elemental hydrogen used as a ligand or an elimination hydrogen as a part of a larger carbon-containing ligand, or hydrogen may be used as a co-reactant.

When a material in accordance with formula (I) or formula (II) is deposited using CVD/ALD (e.g., the seed layer 130, the fill material 140, the overburden 150, or the cap 440, discussed below), the deposition process may take any of a variety of suitable forms. In some embodiments, the primary element, the secondary element, and the tertiary element may be deposited using blanket deposition; such an embodiment may permit the use of precursors 170 (particularly for the secondary element and the tertiary element) and thus may generate a high quality film, but may have poorer gapfill characteristics relative to some other embodiments. In some embodiments, the primary element may be deposited using a bottom-up fill, and the secondary element and the tertiary element may be deposited using blanket deposition; such an embodiment may involve the use of a selective precursor 170 for the primary element. In some embodiments, the primary element may be deposited using a bottom-up fill, and the secondary element may be deposited selectively (utilizing two selective precursors 170); the tertiary element may be deposited either selectively or with a blanket film. In some embodiments, the primary element may be deposited using a blanket deposition and then may be polished, followed by selective deposition of the secondary element; the tertiary element may be deposited either selectively or with a blanket film. In such embodiments, it may be desirable for the deposition process for the primary element to have reasonable gapfill performance, and the precursor 170 for the secondary element may be selective. In some embodiments, the primary element, the secondary element, and optionally the tertiary element may be deposited using a nanolaminate process; such embodiments may involve precursors 170 with good conformality, and may provide an easier final film to alloy in a post-anneal process. When selective deposition is performed, the process may include an inherently selective precursor 170 or selectivity may be generated using an appropriate surface treatment (e.g., self-assembled monolayers, other blocking layers, or activation treatments that create nucleation sites). In examples of the above embodiments in which the ALD/CVD compound is in accordance with formula (I), when there is no tertiary element, the primary element is Co, and the secondary element is Ni, Al, Mn, Si, Cr, V, Mo, Nb, Ta, W, or Zr; when a tertiary element is present, the primary element is Co, the secondary element is Ni, Al, Mn, Si, Cr, V, Nb, or Ta, and the tertiary element is Mo or W. In examples of the above embodiments in which the ALD/CVD compound is in accordance with formula (II), when there is no tertiary element, the primary element is Ni, and the secondary element is Co, Al, Mn, Si, Cr, V, Mo, Nb, Ta, or W; when a tertiary element is present, the primary element is Ni, the secondary element may be Co, Al, Mn, Si, Cr, V, Nb, or Ta, and the tertiary element is Mo or W.

Figure 1C:
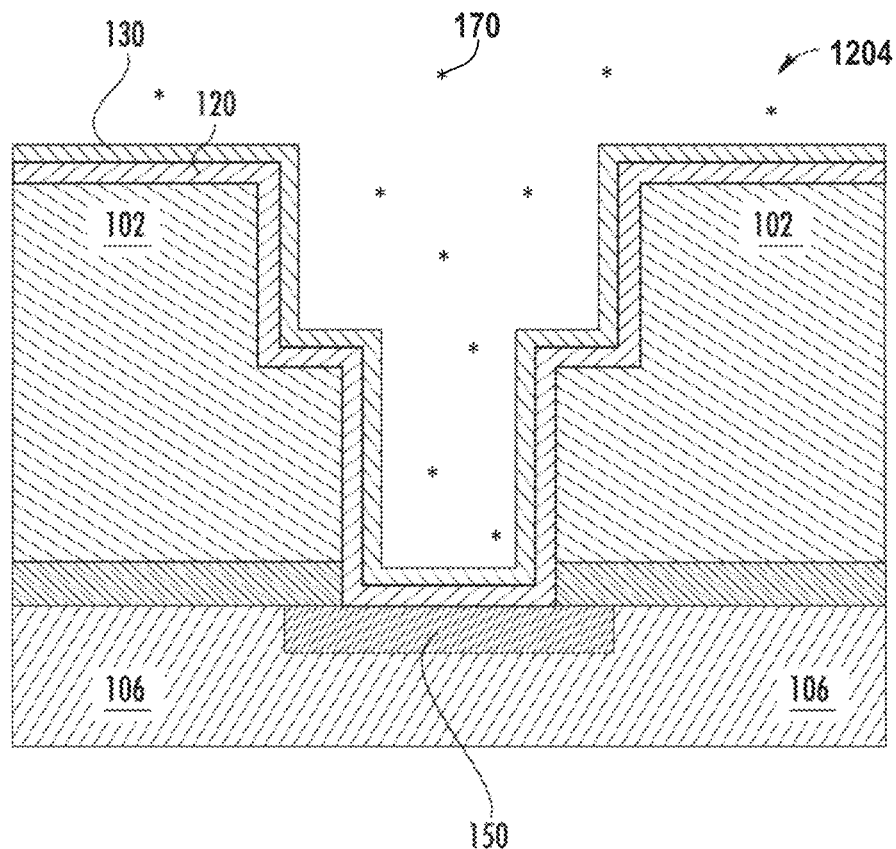
Figure 1D:
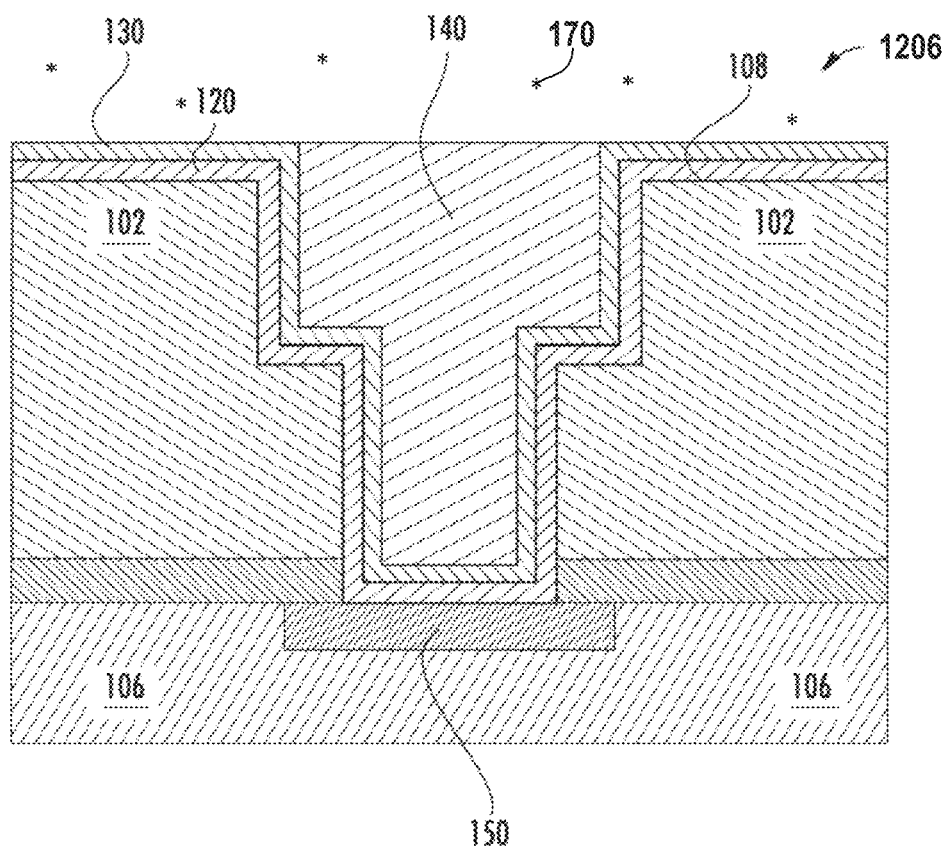

FIG. 1D depicts an assembly 1206 subsequent to forming fill material 140 on the assembly 1204 (FIG. 1C). FIG. 1D depicts an embodiment in which the fill material 140 is deposited on the seed layer 130, such that the fill material 140 completely fills the openings (110, 114). The fill material 140 may include at least one of a compound of formula (I) or a compound of formula (II). Generally, any known fill materials may be used as the fill material 140. For example, in one embodiment, the fill material 140 may include at least 50% cobalt by weight, based on the weight of the fill material 140. In a particular embodiment, the fill material 140 includes about 90% to 100% cobalt by weight of the fill material 140.

The fill material 140 may have a composition that differs from the composition of a seed layer 130. For example, a seed layer 130 may include both silicon and cobalt, while a fill material 140 may include only cobalt. In another example, a seed layer 130 may include a first compound of formula (I) or formula (II), while a fill material 140 may include a second compound of formula (I) or formula (II) that is different from the first compound of formula (I) or formula (II). A fill material 140 also may have a different grain structure than a seed layer 130. For example, a seed layer 130 may have a smaller grain structure than the grain structure of a fill material 140. In one embodiment, a fill material 140 that includes cobalt or nickel is deposited on the assembly 1204.

In some embodiments, the fill material 140 may be formed by a process such as, but not limited to, CVD, ALD, PVD, electroplating, or electroless plating. In one embodiment, the process method used to form the fill material 140 and the process used to form the seed layer 130 are different. Furthermore, the seed layer 130 may be formed conformally, while the fill material 140 may be formed in a non-conformal or bottom-up approach. For example, the seed layer 130 may be formed by an ALD deposition process that forms a conformal layer on exposed surfaces of the barrier/adhesion layer 120 or substrate, while the fill material 140 may be formed by a PVD process that directionally sputters the fill material 140 onto the surfaces of the seed layer 130, with greater deposition rates on flat surfaces as opposed to on sidewall surfaces. In another example, the seed layer 130 may be formed by an ALD deposition process that forms a conformal layer on exposed surfaces of the receiving barrier/adhesion layer 120 or substrate, while the fill material 140 may be formed by an electroplating process that grows the fill material 140 from the surfaces of the seed layer 130. In yet another example, the seed layer 130 may be formed by a CVD deposition process and the fill material 140 may be formed by a PVD process.

In embodiments, the seed layer 130 and the fill material 140 are deposited by the same process (e.g., ALD, CVD, or PVD) but with different sets of deposition parameters, such as pressure, deposition rate, temperature, etc. For example, the seed layer 130 and the fill material 140 may be deposited by a CVD process; however, the set of parameters used in the CVD processing for the seed layer 130, such as deposition pressure and temperature, may be different than the set of parameters used in the CVD processing for the fill material 140. In another example, the seed layer 130 and the fill material 140 may be formed by a PVD process, but the seed layer 130 may be formed by a PVD process with a larger distance between the target and the receiving substrate than the PVD process used to form the fill material 140. In another embodiment, a metal fill material 140 may be formed by a collimated PVD process, while the seed layer 130 may be formed by a non-collimated PVD process. Alternatively, the seed layer may be formed by an ALD process with a lower deposition rate than the deposition rate of the ALD process used to form the fill material 140 such that the seed layer 130 may be formed more conformally than the fill material 140.

A cycling technique may be used to deposit the fill material 140 within the openings 114 and 110. One cycle may include one deposition of the fill material 140 and subsequent annealing. The annealing of one cycle may be performed at parameters (e.g., temperature and/or time) to facilitate reflow of a fill material to improve step coverage. The deposition operation of one cycle may be a short deposition to deposit less fill material, thereby requiring several operations to completely fill the via and line openings 114 and 110. In one embodiment, less than five cycles are required to deposit the fill material 140.

In embodiments in which the fill material 140 includes a compound of formula (I) and/or a compound of formula (II), a CVD or ALD process may be used to deposit the fill material 140, and to do so, one or more precursors 170 may be utilized as part of the CVD/ALD process in accordance with any of the precursors 170, co-reactants, or processes discussed above with reference to the seed layer 130 (e.g., precursors 170 for cobalt, nickel, aluminum, manganese, chromium, vanadium, tantalum, niobium, molybdenum, tungsten, or silicon). In such embodiments, the resulting fill material 140 (and therefore the metal interconnect 100) may include traces of the precursors 170 or co-reactants used, in accordance with any of the embodiments discussed above with reference to the seed layer 130 (e.g., carbon, nitrogen, oxygen, phosphorous, halogens, or hydrogen).

Figure 1E:
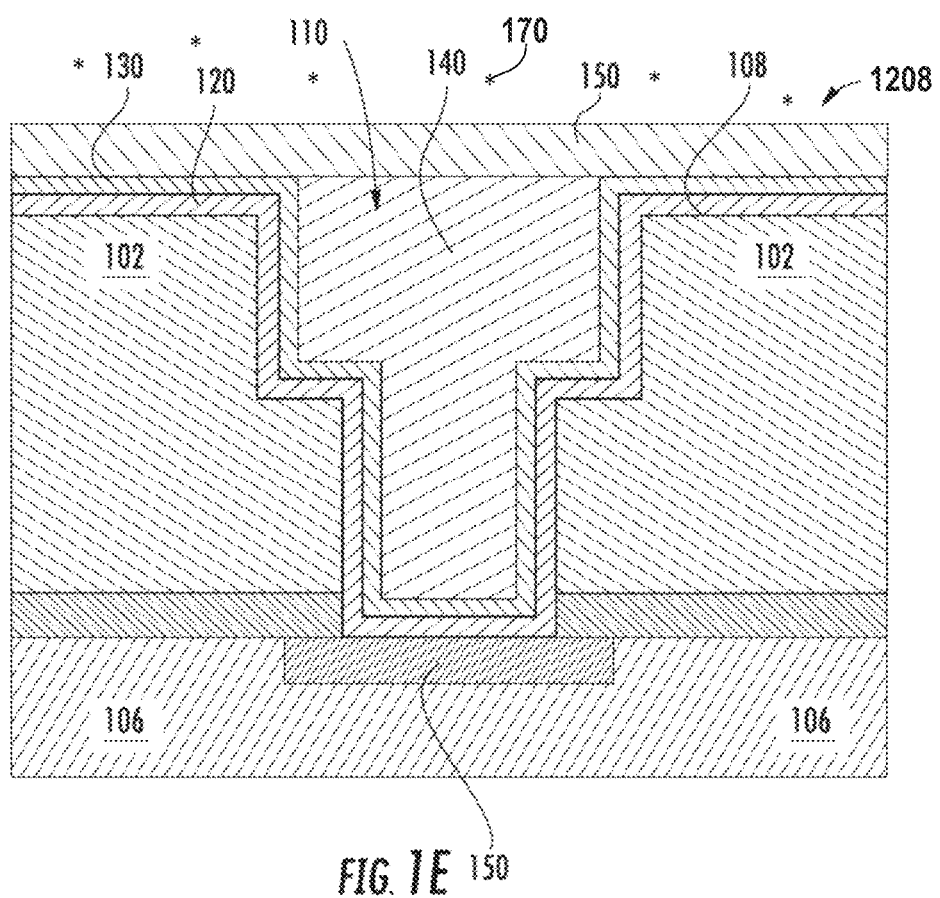

FIG. 1E illustrates an assembly 1208 subsequent to depositing an overburden 150 on the assembly 1206 (FIG. 1D). The overburden 150 may be an overburden of the fill material 140. FIG. 1E depicts an embodiment in which the overburden 150 is deposited on the exposed surfaces of the seed layer 130. The overburden 150 may be formed by a process such as, but not limited to, CVD, ALD, PVD, electroplating, or electroless plating.

In embodiments in which the overburden 150 includes a compound of formula (I) and/or a compound of formula (II), a CVD or ALD process may be used to deposit the overburden 150, and to do so, one or more precursors 170 may be utilized as part of the CVD/ALD process in accordance with any of the precursors 170, co-reactants, or processes discussed above with reference to the seed layer 130 (e.g., precursors 170 for cobalt, nickel, aluminum, manganese, chromium, vanadium, tantalum, niobium, molybdenum, tungsten, or silicon). In such embodiments, the resulting overburden 150 (and therefore the metal interconnect 100) may include traces of the precursors 170 or co-reactants used, in accordance with any of the embodiments discussed above with reference to the seed layer 130 (e.g., carbon, nitrogen, oxygen, phosphorous, halogens, or hydrogen).

Figure 1F:
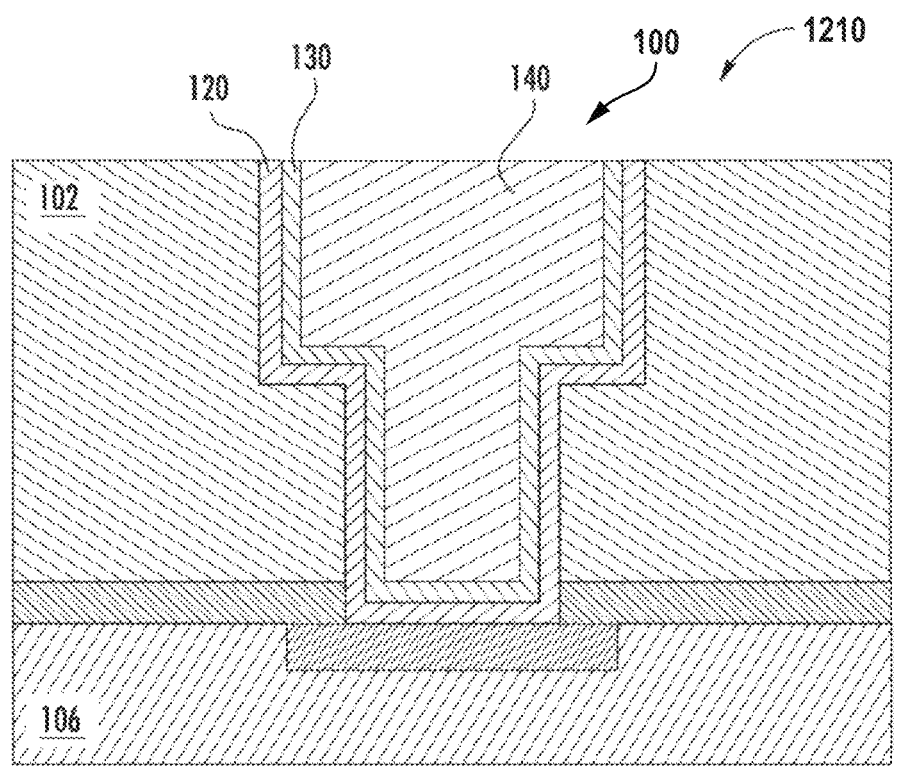

FIG. 1F illustrates an assembly 1210 subsequent to removing the overburden 150, the fill material 140, the seed layer 130, and barrier/adhesion layer 120 deposited above the top surface 108 of the dielectric material 102 of the assembly 1208 (FIG. 1E), or the fill material 140, the seed layer 130, and barrier/adhesion layer 120 deposited above the top surface 108 of the dielectric material 102 of the assembly 1206 (FIG. 1D). In some embodiments, this removal may be the result of a CMP process. The CMP process may be a timed CMP process that is configured to stop at the top surface 108 of the line dielectric layer. In another embodiment, the CMP process may rely on the top surface 108 of the line dielectric layer as a stopping layer. Since it is believed that the thickness of the fill material deposited above a top surface of a line dielectric layer may vary, utilizing a top surface of a dielectric layer as a stopping layer may be a more reliable method. Alternatively or additionally, an etch process may be used to remove a barrier/adhesion layer, fill material, a seed layer, or a combination thereof deposited above a top surface of a dielectric layer.

An annealing process may optionally be performed. The annealing process may be performed after the depositing of an overburden 150. One or more annealing processes also may be performed as a fill material 140 is deposited as described herein. The annealing may promote the growth of larger grain structures within a fill material, which may decrease resistivity, expel impurities from poor grain structures, or a combination thereof. The annealing may include the use of a forming gas, including, but not limited to, nitrogen, hydrogen, argon, or a combination thereof. The annealing may be performed at a temperature less than the thermal budget of backend structures. For example, annealing may be performed at a temperature of about 300° C. to about 400° C. As another example, annealing may be performed at a temperature that is higher than the melting point of a fill material 140, but lower than the thermal budget of backend structures.

In one embodiment, the assembly 120B of FIG. 1E may be subjected to annealing at a temperature of about 300° C. to about 400° C. for about 1 minute to about 1 hour followed by CMP, which results in the metal interconnect 100 depicted in FIG. 1F. Not wishing to be bound by any particular theory, it is believed that the annealing may drive the mixing of the compound of formula (I) and/or (II) of the seed layer 130 into the fully filled feature, as depicted in FIG. 1F. Not wishing to be bound by any particular theory, it is believed that a film of a compound of formula (I) and/or (II) may passivate a top surface of the trench, thereby preventing or reducing the likelihood of corrosion.

Figure 2:
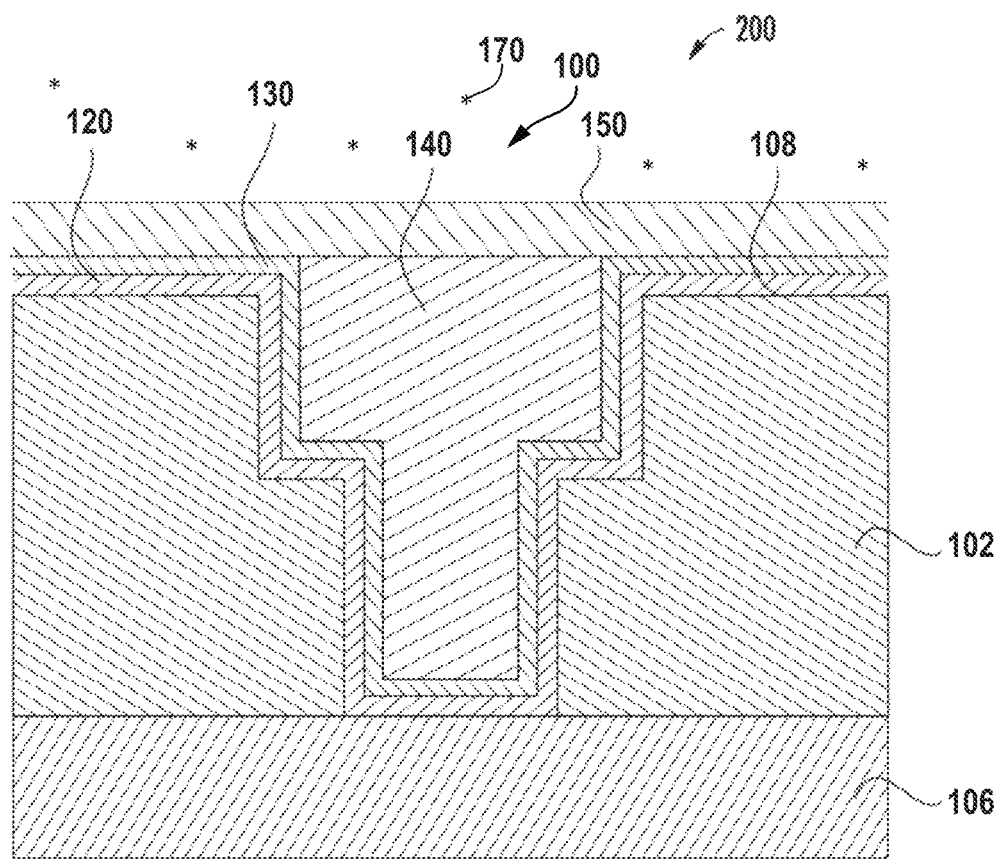
FIG. 2 is a side, cross-sectional view of an embodiment of a metal interconnect.

In embodiments, a seed layer and a fill material include a compound of formula (I) and/or formula (II). For example, FIG. 2 depicts an assembly 200 into which a barrier/adhesion layer 120, a seed layer 130 including a compound of formula (I) and/or formula (II), a fill material 140 including a compound of formula (I) and/or formula (II), and an overburden 150 of cobalt, nickel, or a combination thereof has been deposited. The fill material 140 and the overburden 150 include different materials in the embodiment depicted at FIG. 2. The seed layer 130 and the fill material 140 may include different compounds of formula (I) and/or (II) or different combinations thereof. For example, the seed layer 130 and the fill material 140 may include [1] a compound of formula (I), [2] a compound of formula (II), or [3] a combination thereof. The seed layer 130 may include a compound of formula (I), and the fill material 230 may include a compound of formula (II), or vice versa. The assembly 200 of FIG. 2 may include a dielectric material 102 deposited on a substrate 106, and may include one or more of the additional features depicted in FIG. 1A. The assembly 200 of FIG. 2 may be subjected to annealing, which may drive the mixing of the compounds of formula (I) and/or (II). The assembly then may be polished, such as by CMP. The polishing may remove the overburden and at least a portion of the barrier and/or adhesion layer 120, the seed layer 130, and/or the fill material 140 deposited above the top surface 108 of the dielectric material 102. Not wishing to be bound by any particular theory, it is believed that a film of the compounds of formula (I) and/or (II) may passivate a top surface of the trench, thereby preventing or reducing the likelihood of corrosion. In embodiments in which a material includes a compound of formula (I) and/or a compound of formula (II), a CVD or ALD process may be used to deposit the material, and to do so, one or more precursors 170 may be utilized as part of the CVD/ALD process in accordance with any of the precursors 170, co-reactants, or processes discussed above with reference to the seed layer 130 (e.g., precursors 170 for cobalt, nickel, aluminum, manganese, chromium, vanadium, tantalum, niobium, molybdenum, tungsten, or silicon). In such embodiments, the resulting material (and therefore the metal interconnect 100) may include traces of the precursors 170 or co-reactants used, in accordance with any of the embodiments discussed above with reference to the seed layer 130 (e.g., carbon, nitrogen, oxygen, phosphorous, halogens, or hydrogen).

Figure 3:
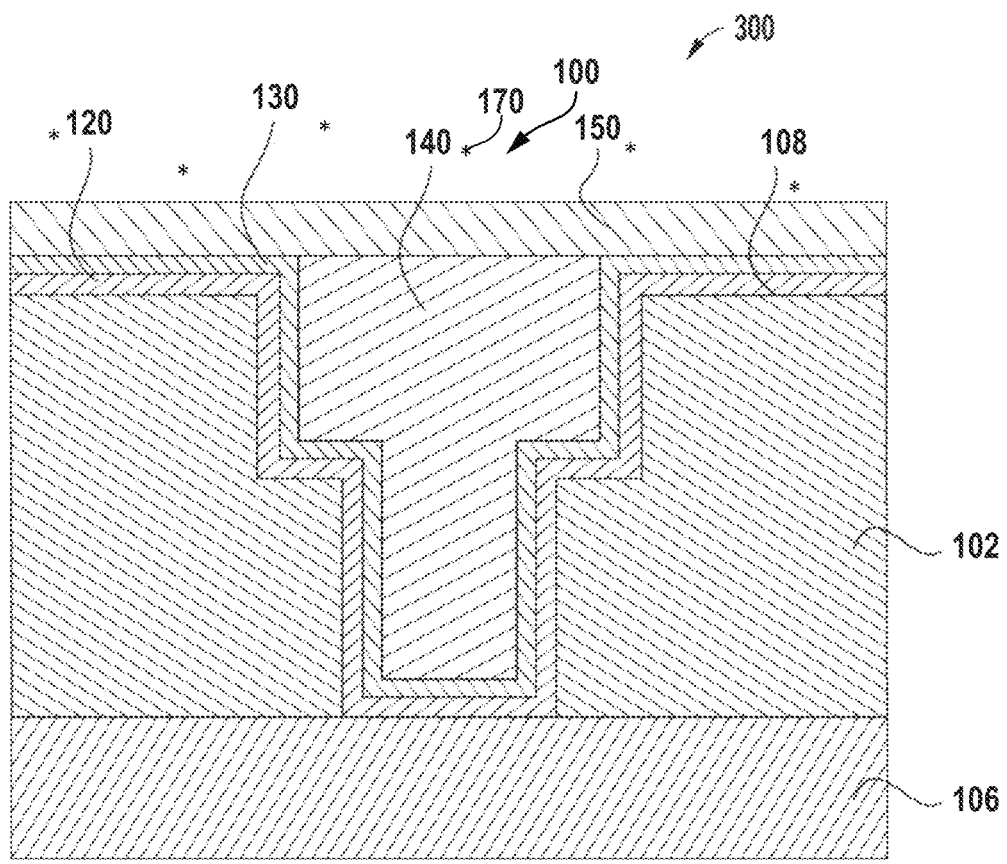
FIG. 3 is a side, cross-sectional view of an embodiment of a metal interconnect that includes an embodiment of an overburden.

In embodiments, an overburden includes a compound of formula (I) and/or formula (II). For example, FIG. 3 depicts an assembly 300 into which a barrier/adhesion layer 120, a seed layer 130 of nickel, cobalt, or a combination thereof, a fill material 140 of cobalt, nickel, or a combination thereof, and an overburden 150 in which a compound of formula (I) and/or formula (II) is present. The fill material 140 and the overburden 150 include different materials in the embodiment depicted at FIG. 3. The assembly 300 of FIG. 3 may include a dielectric material 102 deposited on a substrate 106, and may include one or more of the additional features depicted in FIG. 1A. The assembly 300 of FIG. 3 may be subjected to annealing, which may drive the mixing of the compounds of formula (I) and/or (II) into at least one of the fill material 140 or the seed layer 130. The structure then may be polished, such as by CMP. The polishing may remove the overburden and at least a portion of the barrier/adhesion layer 120, the seed layer 130, and/or the fill material 140 deposited above the top surface 108 of the dielectric material 102. Not wishing to be bound by any particular theory, it is believed that a film of the compounds of formula (I) and/or (II) may passivate a top surface of the trench, thereby preventing or reducing the likelihood of corrosion. In embodiments in which a material includes a compound of formula (I) and/or a compound of formula (II), a CVD or ALD process may be used to deposit the material, and to do so, one or more precursors 170 may be utilized as part of the CVD/ALD process in accordance with any of the precursors 170, co-reactants, or processes discussed above with reference to the seed layer 130 (e.g., precursors 170 for cobalt, nickel, aluminum, manganese, chromium, vanadium, tantalum, niobium, molybdenum, tungsten, or silicon). In such embodiments, the resulting material (and therefore the metal interconnect 100) may include traces of the precursors 170 or co-reactants used, in accordance with any of the embodiments discussed above with reference to the seed layer 130 (e.g., carbon, nitrogen, oxygen, phosphorous, halogens, or hydrogen).

Figure 4:
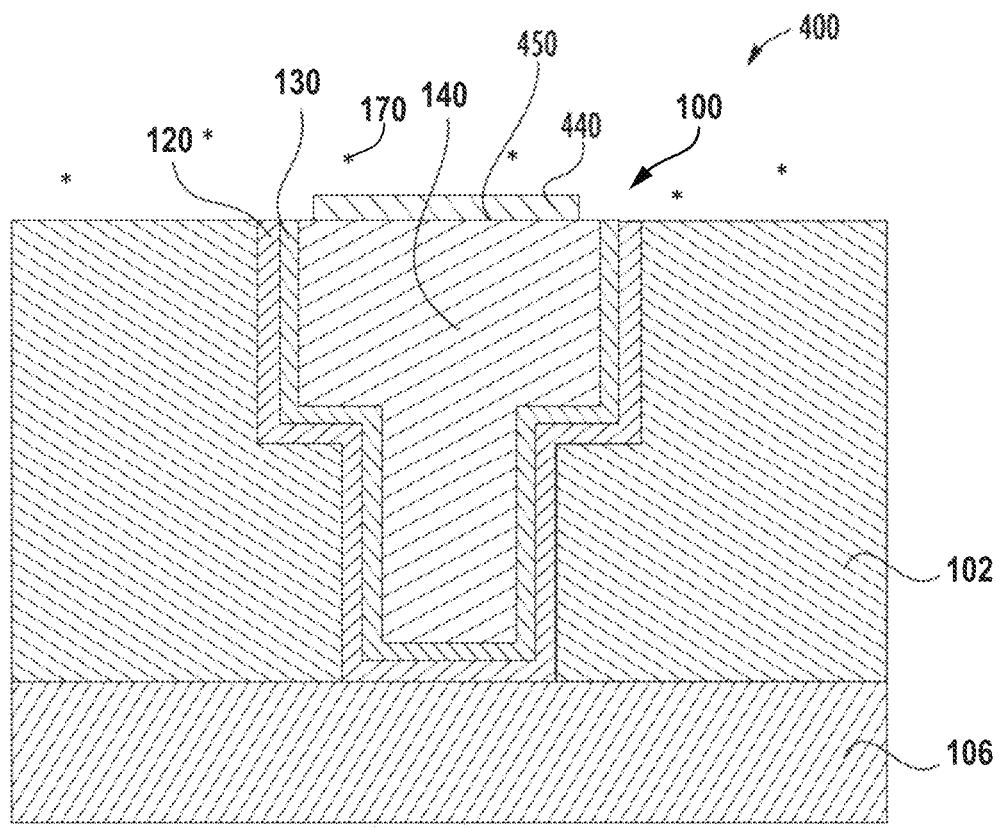
FIG. 4 is a side, cross-sectional view of an embodiment of a metal interconnect that includes an embodiment of a cap.

In embodiments, a cap including a compound of formula (I) and/or (II) is applied to one of the assemblies disclosed herein. For example, FIG. 4 depicts an embodiment of an assembly 400 that includes a barrier/adhesion layer 120, a seed layer 130 of cobalt, nickel, or a combination thereof, a fill material 140 of cobalt, nickel, or a combination thereof, and a cap 440 including a compounds of formula (I) and/or (II) deposited on a top surface 450 of the fill material 140. The cap 440 may correspond to the dimensions of the top surface 450 of the fill material 140, thereby covering all or most of the top surface 450 of the fill material 140, as depicted at FIG. 4. The cap 440 also may cover at least a portion of the exposed surfaces of the seed layer 130, the barrier/adhesion layer 120, or a combination thereof. The cap 440 may be applied after the fill material 140 is deposited in the assembly 400. The cap 440 may be applied after a CMP process is performed. The cap may be deposited using any known techniques, including those described herein, such as ALD, CVD, or electroless. In some embodiments, the cap 440 is a "selective" cap 440 that is deposited on the fill material 140, the exposed surfaces of at least one of the seed layer 130 and the barrier/adhesion layer 120, or a combination thereof, but the "selective" cap 440 is not deposited on the dielectric material 102. In other embodiments, the cap 440 is a "non-selective" cap 440 applied by blanket deposition to a top surface of an assembly in a manner that may deposit a portion of the "non-selective" cap 440 on the dielectric material 102. After its deposition, a "non-selective" cap 440 may be annealed, and then removed by polishing. A "non-selective" cap 440 may include a compound of formula (I) and/or (II). A "non-selective" cap 440 also may include one or more elements (such as an element from which variables "Q" and "Z" herein may be selected), and, upon annealing, the one or more elements may combine with at least one of the fill material 140, seed layer 130, or barrier/adhesion layer 120. The annealing of the "non-selective" cap 440, therefore, may result in the formation of an alloy, including, but not limited to, an alloy according to formula (I) and/or (II). In embodiments in which the cap 440 includes a compound of formula (I) and/or a compound of formula (II), a CVD or ALD process may be used to deposit the cap 440, and to do so, one or more precursors 170 may be utilized as part of the CVD/ALD process in accordance with any of the precursors 170, co-reactants, or processes discussed above with reference to the seed layer 130 (e.g., precursors 170 for cobalt, nickel, aluminum, manganese, chromium, vanadium, tantalum, niobium, molybdenum, tungsten, or silicon). In such embodiments, the resulting cap 440 (and therefore the metal interconnect 100) may include traces of the precursors 170 or co-reactants used, in accordance with any of the embodiments discussed above with reference to the seed layer 130 (e.g., carbon, nitrogen, oxygen, phosphorous, halogens, or hydrogen).

Figure 5:
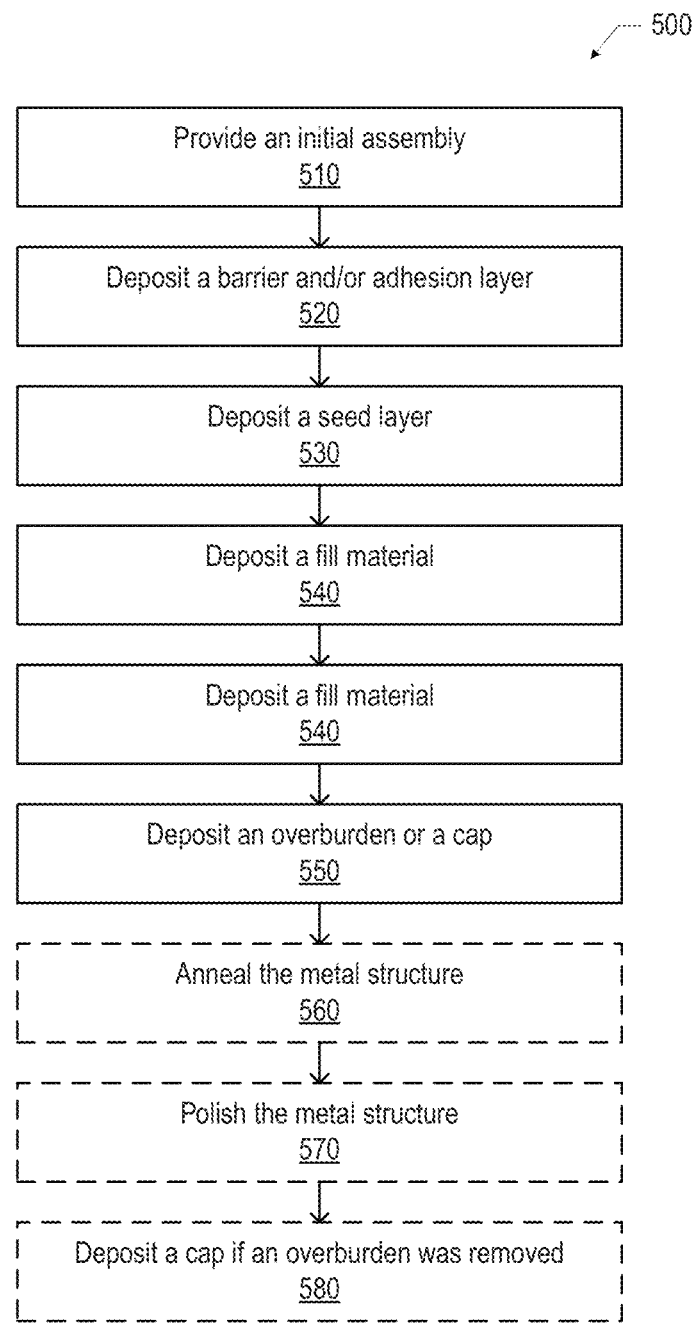
FIG. 5 is a flow chart depicting one embodiment of a method of forming a metal interconnect.

FIG. 5 is a flow chart 500 depicting an embodiment of a method of forming a metal structure, such as those depicted at FIG. 1, FIG. 2, FIG. 3, and FIG. 4, or any of the others disclosed herein. At 510, an initial assembly is provided. At 520, a barrier and/or adhesion layer is deposited on the initial assembly. In other embodiments, the methods provided herein do not include depositing a barrier and/or adhesion layer on the initial assembly. At 530, a seed layer is deposited on the barrier and/or adhesion layer. At 540, a fill material is deposited on the seed layer. At 550, an overburden or a cap is deposited on the fill material, wherein one or more of the seed layer, the fill material, the overburden and/or cap is formed using a CVD/ALD process and any of the precursors disclosed herein. At 560, the optional annealing of the metal structure is performed. At 570, the optional polishing of the metal structure, such as by CMP, is performed. At 580, the optional depositing of a cap is performed, which may be performed if an overburden was previously deposited on the assembly and removed by polishing.

The metal interconnects 100 disclosed herein may be included in any suitable electronic component. FIGS. 6-10 illustrate various examples of apparatuses that may include any of the metal interconnects 100 disclosed herein.

Figure 6:
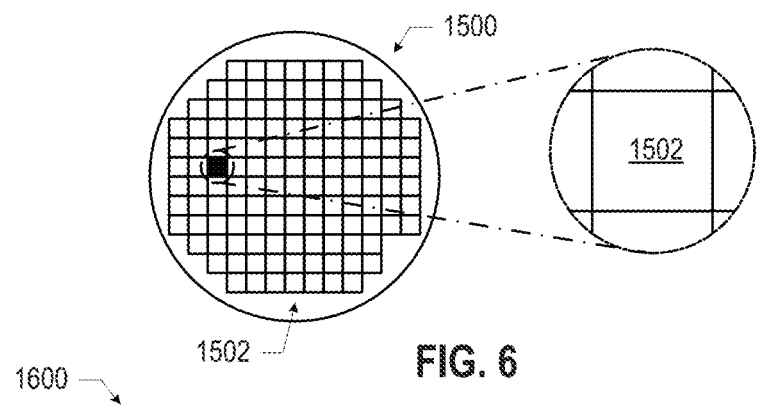
FIG. 6 is a top view of a wafer and dies that may include a metal interconnect in accordance with any of the embodiments disclosed herein.

FIG. 6 is a top view of a wafer 1500 and dies 1502 that may include one or more metal interconnects 100, or may be included in an IC package including one or more metal interconnects 100 (e.g., as discussed below with reference to FIG. 8) in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more metal interconnects 100 (e.g., as discussed below with reference to FIG. 7), one or more transistors (e.g., some of the transistors 1640 of FIG. 7, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 10) or other logic that is configured to store information in the memory devices or execute instructions stored in the memory array.

Figure 7:
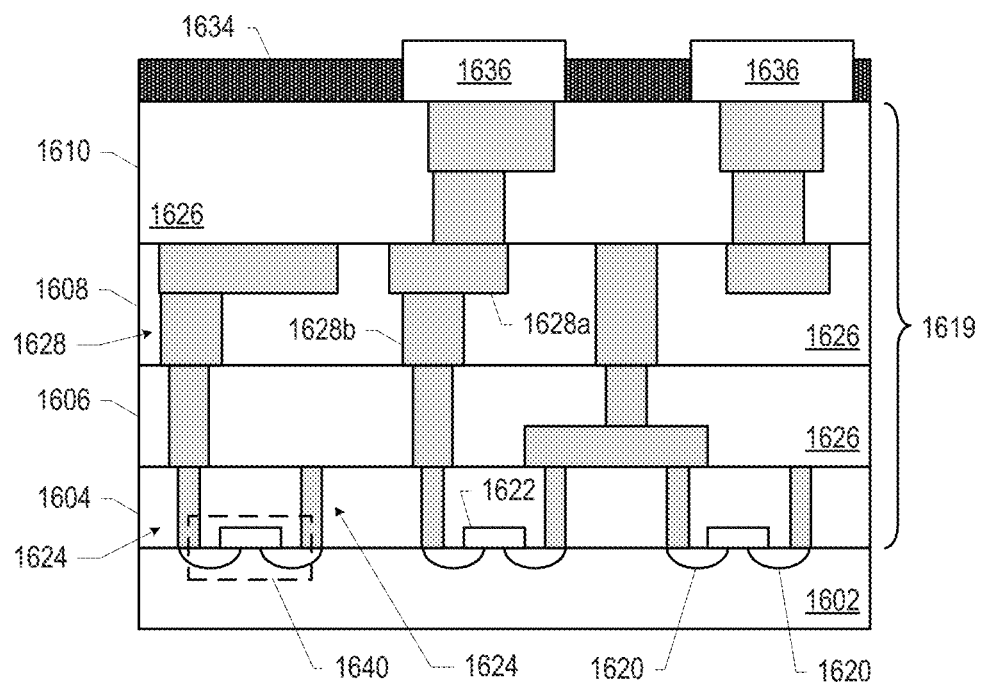
FIG. 7 is a side, cross-sectional view of an integrated circuit (IC) device that may include a metal interconnect in accordance with any of the embodiments disclosed herein.

FIG. 7 is a side, cross-sectional view of an IC device 1600 that may include one or more metal interconnects 100, or may be included in an IC package including one or more metal interconnects 100 (e.g., as discussed below with reference to FIG. 8), in accordance with any of the embodiments disclosed herein. One or more of the IC devices 1600 may be included in one or more dies 1502 (FIG. 6). The IC device 1600 may be formed on a substrate 1602 (e.g., the wafer 1500 of FIG. 6) and may be included in a die (e.g., the die 1502 of FIG. 6). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 6) or a wafer (e.g., the wafer 1500 of FIG. 6).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer

1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 7 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

In some embodiments, the gates 1622 of the transistors 1640 may be formed using the techniques disclosed herein with reference to the metal interconnects 100. For example, a gate 1622 may include a compound in accordance with formula (I) and/or formula (II).

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 7 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, the interconnect structures 1628 may take the form of any of the metal interconnects 100 disclosed herein. One or more metal interconnects 100 in the metallization stack 1619 may be coupled to any suitable ones of the devices in the device layer 1604, and/or to one or more of the conductive contacts 1636 (discussed below).

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 7). Although a particular number of interconnect layers 1606-1610 is depicted in FIG. 7, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 7. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 7. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 7, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 8:
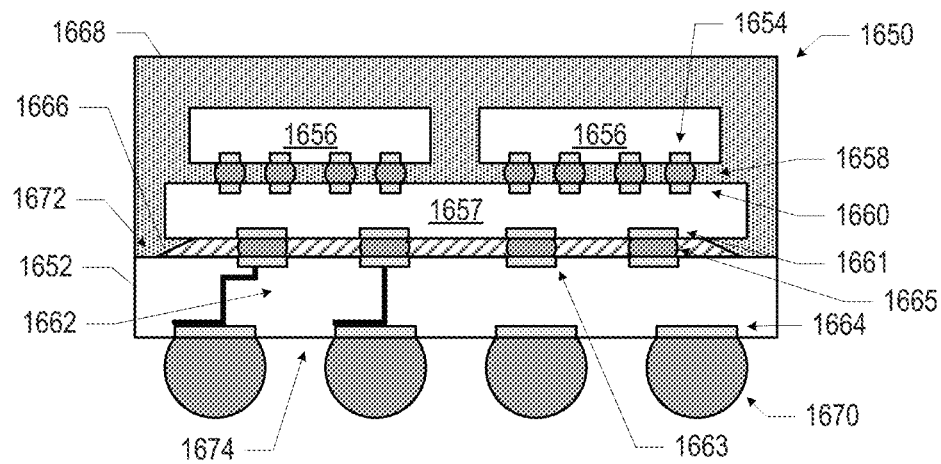
FIG. 8 is a side, cross-sectional view of an IC package that may include a metal interconnect in accordance with various embodiments.

FIG. 8 is a side, cross-sectional view of an example IC package 1650 that may include one or more metal interconnects 100. In some embodiments, the IC package 1650 may be a system-in-package (SiP).

The package substrate 1652 may be formed of a dielectric material (e.g., a ceramic, a buildup film, an epoxy film having filler particles therein, etc.), and may have conductive pathways extending through the dielectric material between the face 1672 and the face 1674, or between different locations on the face 1672, and/or between different locations on the face 1674. These conductive pathways may take the form of any of the interconnects 1628 discussed above with reference to FIG. 7. In some embodiments, the conductive pathways through the package substrate 1652 (and/or though the interposer 1657) may include any of the metal interconnects 100 disclosed herein; in other embodiments, the conductive pathways through the package substrate 1652 (and/or through the interposer 1657) may include other materials and/or structures.

The package substrate 1652 may include conductive contacts 1663 that are coupled to conductive pathways 1662 through the package substrate 1652, allowing circuitry within the dies 1656 and/or the interposer 1657 to electrically couple to various ones of the conductive contacts 1664 (or to other devices included in the package substrate 1652, not shown).

The IC package 1650 may include an interposer 1657 coupled to the package substrate 1652 via conductive contacts 1661 of the interposer 1657, first-level interconnects 1665, and the conductive contacts 1663 of the package substrate 1652. The first-level interconnects 1665 illustrated in FIG. 8 are solder bumps, but any suitable first-level interconnects 1665 may be used. In some embodiments, no interposer 1657 may be included in the IC package 1650; instead, the dies 1656 may be coupled directly to the conductive contacts 1663 at the face 1672 by first-level interconnects 1665.

The IC package 1650 may include one or more dies 1656 coupled to the interposer 1657 via conductive contacts 1654 of the dies 1656, first-level interconnects 1658, and conductive contacts 1660 of the interposer 1657. The conductive contacts 1660 may be coupled to conductive pathways (not shown) through the interposer 1657, allowing circuitry within the dies 1656 to electrically couple to various ones of the conductive contacts 1661 (or to other devices included in the interposer 1657, not shown). The first-level interconnects 1658 illustrated in FIG. 8 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket).

In some embodiments, an underfill material 1666 may be disposed between the package substrate 1652 and the interposer 1657 around the first-level interconnects 1665, and a mold compound 1668 may be disposed around the dies 1656 and the interposer 1657 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 8 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 9.

The dies 1656 may take the form of any of the embodiments of the die 1502 discussed herein (e.g., may include any of the embodiments of the IC device 1600). In embodiments in which the IC package 1650 includes multiple dies 1656, the IC package 1650 may be referred to as a multi-chip package (MCP). The dies 1656 may include circuitry to perform any desired functionality. For example, or more of the dies 1656 may be logic dies (e.g., silicon-based dies), and one or more of the dies 1656 may be memory dies (e.g., high bandwidth memory). In some embodiments, the die 1656 may include one or more metal interconnects 100 (e.g., as discussed above with reference to FIG. 6 and FIG. 7); in other embodiments, the die 1656 may not include any metal interconnects 100.

Although the IC package 1650 illustrated in FIG. 8 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although two dies 1656 are illustrated in the IC package 1650 of FIG. 8, an IC package 1650 may include any desired number of dies 1656. An IC package 1650 may include additional passive components, such as surface-mount resistors, capacitors, and inductors disposed on the first face 1672 or the second face 1674 of the package substrate 1652, or on either face of the interposer 1657. More generally, an IC package 1650 may include any other active or passive components known in the art.

Figure 9:
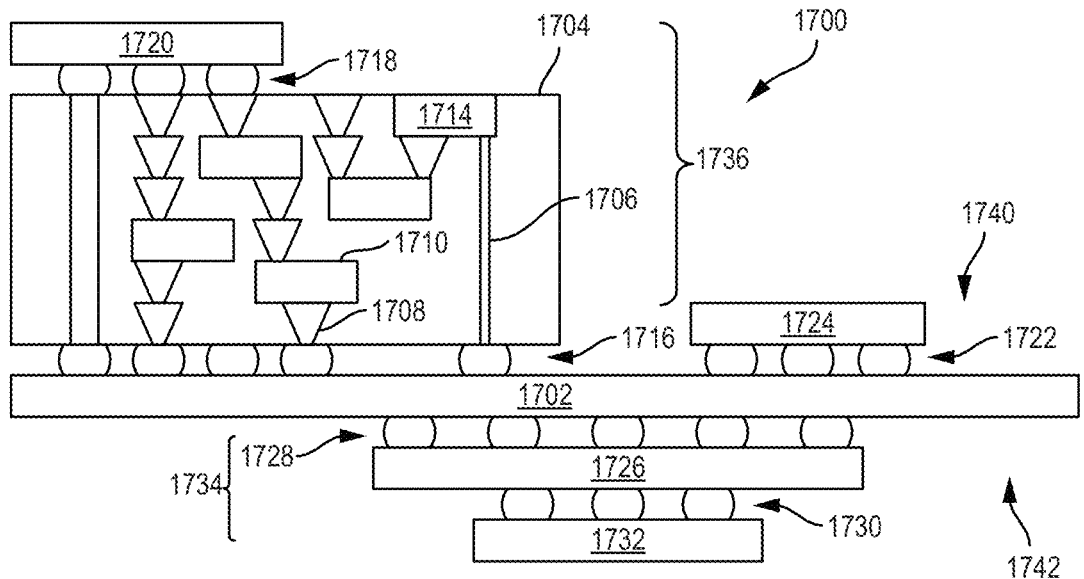
FIG. 9 is a side, cross-sectional view of an IC device assembly that may include a metal interconnect in accordance with any of the embodiments disclosed herein.

FIG. 9 is a side, cross-sectional view of an IC device assembly 1700 that may include one or more IC packages or other electronic components (e.g., a die) including one or more metal interconnects 100, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 8 (e.g., may include one or more metal interconnects 100 in a package substrate 1652 or in a die 1656).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 9 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 9), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 9, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 6), an IC device (e.g., the IC device 1600 of FIG. 7), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 9, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal interconnects 1708 and vias 1710, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 9 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

FIG. 10 is a block diagram of an example electrical device 1800 that may include one or more metal interconnects 100, in accordance with any of the embodiments disclosed herein. For example, any suitable ones of the components of the electrical device 1800 may include one or more of the IC device assemblies 1700, IC packages 1650, IC devices 1600, or dies 1502 disclosed herein. A number of components are illustrated in FIG. 10 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single SoC die.

Additionally, in various embodiments, the electrical device 1800 may not include one or more of the components illustrated in FIG. 10, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide examples of various ones of the embodiments disclosed herein.

Example 1 is a metal structure, including: A or B; and one or more of carbon, nitrogen, oxygen, phosphorous, a halogen, or hydrogen; wherein A includes: b weight-percent of Co; q weight-percent of Q; and z weight-percent of Z; wherein a sum of b, q, and z equals 100%; b is between 50% and Example 99.99%; q is between Example 0.01% and 50%; z is between 0% and Example 49.9%; Q, when z is 0%, is selected from Ni, Al, Mn, Si, Cr, V, Mo, Nb, Ta, W, or Zr; Q, when z is not 0%, is selected from Ni, Al, Mn, Si, Cr, V, Nb, or Ta; and Z is selected from Mo or W; wherein B includes: d weight-percent of Ni; e weight-percent of X; and f weight-percent of G; wherein a sum of d, e, and f equals 100%; d is between 50% and 100%, e is between 0% and 50%, f is between 0% and Example 49.99%; X, when f is 0%, is selected from Co, Al, Mn, Si, Cr, V, Mo, Nb, Ta, or W; X, when f is not 0%, is selected from Co, Al, Mn, Si, Cr, V, Nb, or Ta; and G is selected from Mo or W.

Example 2 includes the subject matter of Example 1, and further specifies that the metal structure includes A.

Example 3 includes the subject matter of Example 1, and further specifies that the metal structure includes B.

Example 4 includes the subject matter of any of Examples 1-3, and further specifies that the metal structure includes carbon.

Example 5 includes the subject matter of any of Examples 1-3, and further specifies that the metal structure includes nitrogen.

Example 6 includes the subject matter of any of Examples 1-3, and further specifies that the metal structure includes phosphorous.

Example 7 includes the subject matter of any of Examples 1-3, and further specifies that the metal structure includes a halogen.

Example 8 includes the subject matter of any of Examples 1-3, and further specifies that the metal structure includes hydrogen.

Example 9 includes the subject matter of any of Examples 1-8, and further specifies that the metal structure is a transistor gate.

Example 10 includes the subject matter of any of Examples 1-8, and further specifies that the metal structure is a metal interconnect.

Example 11 includes the subject matter of any of Examples 1-10, and further specifies that the metal structure is included in an integrated circuit (IC) die.

Example 12 includes the subject matter of any of Examples 1-10, and further specifies that the metal structure is included in a package substrate.

Example 13 includes the subject matter of any of Examples 1-12, and further specifies that the metal structure includes a seed layer, a fill material, or a cap, and A or B is present in at least one of the seed layer, the fill material, or the cap.

Example 14 is an integrated circuit (IC) die, including: a metal interconnect, including: one or more of carbon, nitrogen, oxygen, phosphorous, a halogen, or hydrogen; and a compound according to formula (I) or formula (II)—$Co_bQ_qZ_z$ (formula (I)), $Ni_dX_eG_f$ (formula (II)); wherein b, q, and z are weight percentages based on a total weight of the compound according to formula (I), b is between 50% and Example 99.99%, q is between Example 0.01% and 50%, and z is between 0% and Example 49.9%; wherein Q, when z is 0%, is selected from Ni, Al, Mn, Si, Cr, V, Mo, Nb, Ta, W, or Zr; wherein Q, when z is not 0%, is selected from Ni, Al, Mn, Si, Cr, V, Nb, or Ta; wherein Z is selected from Mo or W; and wherein d, e, and f are weight percentages based on a total weight of the compound according to formula (II), d is between 50% and 100%, e is between 0% and 50%, f is between 0% and Example 49.99%; wherein X, when f is 0%, is selected from Co, Al, Mn, Si, Cr, V, Mo, Nb, Ta, or W; wherein X, when f is not 0%, is selected from Co, Al, Mn, Si, Cr, V, Nb, or Ta; and wherein G is selected from Mo or W.

Example 15 includes the subject matter of Example 14, and further specifies that the metal interconnect includes the compound according to formula (I).

Example 16 includes the subject matter of Example 14, and further specifies that the metal interconnect includes the compound according to formula (II).

Example 17 includes the subject matter of any of Examples 14-16, and further specifies that the metal interconnect includes carbon.

Example 18 includes the subject matter of any of Examples 14-16, and further specifies that the metal interconnect includes nitrogen.

Example 19 includes the subject matter of any of Examples 14-16, and further specifies that the metal interconnect includes phosphorous.

Example 20 includes the subject matter of any of Examples 14-16, and further specifies that the metal interconnect includes a halogen.

Example 21 includes the subject matter of any of Examples 14-16, and further specifies that the metal interconnect includes hydrogen.

Example 22 includes the subject matter of any of Examples 14-21, and further includes: one or more transistors.

Example 23 includes the subject matter of any of Examples 14-22, and further includes: one or more conductive pads at an exterior face of the IC die.

Example 24 includes the subject matter of any of Examples 14-23, and further specifies that the metal interconnect includes a seed layer, a fill material, or a cap, and the compound according to formula (I) or formula (II) is present in at least one of the seed layer, the fill material, or the cap.

Example 25 is a method of forming a metal structure, including: providing an initial structure; and forming a metal on the initial structure by chemical vapor deposition (CVD); wherein a precursor used during CVD includes one or more of carbon, nitrogen, oxygen, phosphorous, a halogen, or hydrogen; wherein the metal includes A or B; wherein A includes: b weight-percent of Co; q weight-percent of Q; and z weight-percent of Z; wherein a sum of b, q, and z equals 100%; b is between 50% and Example 99.99%; q is between Example 0.01% and 50%; z is between 0% and Example 49.9%; Q, when z is 0%, is selected from Ni, Al, Mn, Si, Cr, V, Mo, Nb, Ta, W, or Zr; Q, when z is not 0%, is selected from Ni, Al, Mn, Si, Cr, V, Nb, or Ta; and Z is selected from Mo or W; wherein B includes: d weight-percent of Ni; e weight-percent of X; and f weight-percent of G; wherein a sum of d, e, and f equals 100%; d is between 50% and 100%, e is between 0% and 50%, f is between 0% and Example 49.99%; X, when f is 0%, is selected from Co, Al, Mn, Si, Cr, V, Mo, Nb, Ta, or W; X, when f is not 0%, is selected from Co, Al, Mn, Si, Cr, V, Nb, or Ta; and G is selected from Mo or W.

Example 26 includes the subject matter of Example 25, and further includes: forming the initial structure.

Example 27 includes the subject matter of Example 26, and further specifies that forming the initial structure includes depositing a barrier and/or adhesion layer on a damascene or a dual damascene structure.

Example 28 includes the subject matter of any of Examples 25-27, and further specifies that the metal is a seed layer.

Example 29 includes the subject matter of any of Examples 25-27, and further specifies that the metal is a fill material.

Example 30 includes the subject matter of any of Examples 25-27, and further specifies that the metal is a cap.

Example 31 includes the subject matter of any of Examples 25-30, and further specifies that forming the metal on the initial structure by CVD includes performing atomic layer deposition (ALD).

Example 32 includes the subject matter of any of Examples 25-31, and further specifies that the initial structure includes: a dielectric layer deposited on a substrate, the substrate comprising a conductive region; and an opening in the dielectric layer exposing the conductive region of the substrate, the opening having a lower portion and an upper portion, wherein the upper portion is wider than the lower portion.

Example 33 is a computing device, including: an integrated circuit (IC) package including an IC die coupled to a package substrate; a circuit board, wherein the IC package is coupled to the circuit board; wherein the computing device includes a metal structure including A or B; wherein the metal structure also includes a trace of a chemical vapor deposition (CVD) precursor material; wherein A includes: b weight-percent of Co; q weight-percent of Q; and z weight-percent of Z; wherein a sum of b, q, and z equals 100%; b is between 50% and Example 99.99%; q is between Example 0.01% and 50%; z is between 0% and Example 49.9%; Q, when z is 0%, is selected from Ni, Al, Mn, Si, Cr, V, Mo, Nb, Ta, W, or Zr; Q, when z is not 0%, is selected from Ni, Al, Mn, Si, Cr, V, Nb, or Ta; and Z is selected from Mo or W; wherein B includes: d weight-percent of Ni; e weight-percent of X; and f weight-percent of G; wherein a sum of d, e, and f equals 100%; d is between 50% and 100%, e is between 0% and 50%, f is between 0% and Example 49.99%; X, when f is 0%, is selected from Co, Al, Mn, Si, Cr, V, Mo, Nb, Ta, or W; X, when f is not 0%, is selected from Co, Al, Mn, Si, Cr, V, Nb, or Ta; and G is selected from Mo or W.

Example 34 includes the subject matter of Example 33, and further specifies that the trace of the CVD precursor material includes one or more of carbon, nitrogen, oxygen, phosphorous, a halogen, or hydrogen.

Example 35 includes the subject matter of any of Examples 33-34, and further specifies that the metal structure is included in the IC die.

Example 36 includes the subject matter of any of Examples 33-34, and further specifies that the metal structure is included in the package substrate.

Example 37 includes the subject matter of any of Examples 33-36, and further specifies that the metal structure is a metal interconnect.

Example 38 includes the subject matter of any of Examples 33-37, and further specifies that the computing device is a laptop, a handheld computing device, or a server.

Example 39 includes the subject matter of any of Examples 33-38, and further includes: a display coupled to the circuit board.

Example 40 includes the subject matter of any of Examples 33-39, and further includes: an antenna coupled to the circuit board.

Example 41 is a material including any of the precursor materials disclosed herein.

Example 42 is a method of forming a metal structure, including forming a metal on an initial structure by chemical vapor deposition using any of the precursor materials disclosed herein.

Example 43 is a metal formed using chemical vapor deposition and any of the precursor materials disclosed herein.

The invention claimed is:

1. A metal structure, comprising:
   A wherein A includes:
   b weight-percent of Co;
   q weight-percent of Q; and
   z weight-percent of Z;
   wherein a sum of b, q, and z equals 100%; b is between 50% and 99.99%; q is between 0.01% and 50%; z is greater than 0.01% and not greater than 1%; Q is selected from Ni, Al, Mn, Si, Cr, V, Nb, or Ta; and Z is selected from Mo or W.

2. The metal structure of claim 1, wherein the metal structure includes carbon.

3. The metal structure of claim 1, wherein the metal structure includes nitrogen.

4. The metal structure of claim 1, wherein the metal structure includes phosphorous.

5. The metal structure of claim 1, wherein the metal structure includes a halogen.

6. The metal structure of claim 1, wherein the metal structure includes hydrogen.

7. The metal structure of claim 1, wherein the metal structure is a transistor gate.

8. The metal structure of claim 1, wherein the metal structure is a metal interconnect.

9. The metal structure of claim 1, wherein the metal structure is included in an integrated circuit (IC) die.

10. The metal structure of claim 1, wherein the metal structure is included in a package substrate.

11. The metal structure of claim 1, wherein the metal structure includes a seed layer, a fill material, or a cap, and A is present in at least one of the seed layer, the fill material, or the cap.

12. An integrated circuit (IC) die, comprising:
    a metal interconnect, including:
    a compound according to formula (I)—
    $$Co_b Q_q Z_z \quad \text{(formula(I))};$$
    wherein b, q, and z are weight percentages based on a total weight of the compound according to formula (I), b is between 50% and 99.99%, q is between 0.01% and 50%, and z is greater than 0.01% and not greater than 1%;
    wherein Q is selected from Ni, Al, Mn, Si, Cr, V, Nb, or Ta;
    wherein Z is selected from Mo or W.

13. The IC die of claim 12, further comprising:
    one or more transistors.

14. The IC die of claim 12, further comprising:
    one or more conductive pads at an exterior face of the IC die.

15. A metal structure, comprising:
    A wherein A includes:
    b weight-percent of Co;
    q weight-percent of Q; and
    z weight-percent of Z;
    wherein a sum of b, q, and z equals 100%; b is between 50% and 99.99%; q is between 0.01% and 50%; z is greater than 0% and less than 49.9%; Q is selected from Ni, Al, Mn, Si, Cr, V, Nb, or Ta; Z is selected from Mo or W; and A has a greater melting point than a melting point of Co.

16. The metal structure of claim 15, wherein z is between 0.01% and 1%.

17. The metal structure of claim 15, wherein the metal structure is an interconnect structure of an integrated circuit.

18. The metal structure of claim 15, wherein the metal structure is a transistor gate.

19. The metal structure of claim 15, wherein A has a greater activation energy than an activation energy of Co.

20. The metal structure of claim 15, wherein A has a lower bulk resistivity than a bulk resistivity of Co.

* * * * *